(12) United States Patent
Alsaleem et al.

(10) Patent No.: US 12,291,446 B2
(45) Date of Patent: May 6, 2025

(54) ARTIFICIAL INTELLIGENCE-BASED ANALOG SENSORS AND WEARABLE DEVICES INCORPORATING THE SAME

(71) Applicant: NUtech Ventures, Lincoln, NE (US)

(72) Inventors: Fadi Alsaleem, Omaha, NE (US); Mohammad H. Hasan, Omaha, NE (US)

(73) Assignee: NUtech Ventures, Lincoln, NE (US)

(*) Notice: Subject to any disclaimer, the term of this patent is extended or adjusted under 35 U.S.C. 154(b) by 616 days.

(21) Appl. No.: 17/394,169

(22) Filed: Aug. 4, 2021

(65) Prior Publication Data

US 2022/0041433 A1 Feb. 10, 2022

Related U.S. Application Data

(60) Provisional application No. 63/060,903, filed on Aug. 4, 2020.

(51) Int. Cl.
| | |
|---|---|
| *B81B 7/00* | (2006.01) |
| *G05B 13/04* | (2006.01) |
| *G06N 3/044* | (2023.01) |
| *G06N 3/063* | (2023.01) |
| *G06N 3/08* | (2023.01) |

(52) U.S. Cl.
CPC .............. *B81B 7/008* (2013.01); *G05B 13/04* (2013.01); *G06N 3/044* (2023.01); *G06N 3/063* (2013.01); *G06N 3/08* (2013.01); *B81B 2201/0235* (2013.01); *B81B 2203/0118* (2013.01); *B81B 2203/04* (2013.01)

(58) Field of Classification Search
None
See application file for complete search history.

(56) References Cited

U.S. PATENT DOCUMENTS

| | | |
|---|---|---|
| 2018/0164432 A1 | 6/2018 | Lal et al. |
| 2020/0041964 A1 | 2/2020 | Alsaleem |

OTHER PUBLICATIONS

Arena et al. "Motor-Skill Learning in an Insect Inspired Neuro-Computational Control System," Frontiers in Neurorobotics, vol. 12, No. 1, Art. 12 (2017).

(Continued)

*Primary Examiner* — Carlos R Ortiz Rodriguez
(74) *Attorney, Agent, or Firm* — Arthur J. Bobel; Leydig, Voit, Mayer, LTD.

(57) ABSTRACT

A micro-electro-mechanical-systems (MEMS) device is disclosed that is configured to operate as a reservoir computer including performing sensing and computing co-locally. The MEMS device includes circuitry for: generating a modulated input signal based on an input signal; generating a MEMS deflection signal based on the modulated input signal and a time-delayed MEMS deflection signal; sampling the MEMS deflection signal N times during a time internal T to generate a MEMS deflection matrix, wherein MEMS deflection matrix has a size M×N, wherein N corresponds to a number of virtual nodes of the reservoir computer and M is a number of time steps of time interval T; receiving a trained weight matrix, wherein the trained weight matrix is trained by linear regression; and multiplying the MEMS deflection matrix by the trained weight matrix to generate an output signal that classifies the input signal.

20 Claims, 19 Drawing Sheets

(56) References Cited

OTHER PUBLICATIONS

Appeltant et al. "Information Processing Using a Single Dynamical Node as Complex System," Nature communications, vol. 2, No. 1 (2011).
Alsaleem et al. "On the nonlinear resonances and dynamic pull-in of electrostatically actuated resonators," Journal of Micromechanics and Microengineering, vol. 19, No. 4 (2009).
Dion et al. "Reservoir computing with a single delay-coupled non-linear mechanical oscillator," Journal of Applied Physics, vol. 124, No. 15 (2018).
Tsunegi et al. "Physical reservoir computing based on spin torque oscillator with forced synchronization," Applied Physics Letters, vol. 114, Issue 16 (Apr. 22, 2019) (available at: https://doi.org/10.1063/1.5081797).
Barazani et al. "Microfabricated Neuroaccelerometer: Integrating Sensing and Reservoir Computing in MEMS," Journal of Microelectromechanical Systems, vol. 29, No. 3, pp. 338-347 (Jun. 2020).
Lu, Wei. "A Bio-inspired Neuromorphic Chip for Efficient Computing and Bio-interface," International Conference for Advanced Neurotechnology (Jun. 15, 2016) (available at: https://www.youtube.com/watch?v=4mBW8QNX4ac).

(a1) 
(a2) 
(b1) 
(b2)

ARTIFICIAL INTELLIGENCE-BASED ANALOG SENSORS AND WEARABLE DEVICES INCORPORATING THE SAME

CROSS-REFERENCE TO RELATED APPLICATIONS

This application claims the benefit of U.S. Provisional Application No. 63/060,903, filed on Aug. 4, 2020, the entire contents of which is hereby incorporated by reference.

BACKGROUND

Recently, there has been a big push to incorporate more computing power into wearable devices to enable their full potential in, among other things, gesture recognition and medical applications, such as detecting elderly falls or diagnosing disease. These tasks often require running complex machine learning algorithms, such as artificial neural networks (ANNs). However, using traditional power-inefficient and relatively bulky digital computers to execute ANNs is unsatisfactory in the context of wearable devices.

Cloud computing reduces the need for powerful onboard processors by offloading processing operations to a server. However, utilizing cloud computing in conjunction with wearable devices significantly increases battery consumption of the wearable devices due to data transmission, especially at higher data transmission rates, increases security risks, and may necessitate constant wireless connectivity.

Accordingly, the remains a need in the art for wearable devices that can more effectively utilize machine learning or artificial intelligence computing.

SUMMARY

According to various embodiments, a fully-integrated sensing and neural micro-electro-mechanical-systems (MEMS) computing device is provided. In various embodiments herein, a sensing and computing scheme is provided using one or more MEMS devices capable of performing a computational task (e.g., classification) at the sensor node to offload a central processor in wearable electronics and enable complex computation using simple digital computing schemes. In certain embodiments, the MEMS device measures a property, such as acceleration, and simultaneously performs classification to produce high-level information while meeting the very tight space and power budget in wearable devices. Thus, embodiments of the disclosure advantageously enable the production of a new generation of wearable devices that may run off a permanent battery, yet are capable of performing highly intelligent computing tasks.

Various embodiment provide a method, a MEMS device, and a wearable device, where the MEMS device is operated as a reservoir computer. The method includes: generating a modulated input signal based on an input signal, wherein the input signal is a continuous signal and the modulated input signal is a discretized signal; generating a MEMS deflection signal based on the modulated input signal and a time-delayed MEMS deflection signal; sampling the MEMS deflection signal N times during a time internal T to generate a MEMS deflection matrix, wherein MEMS deflection matrix has a size M×N, wherein N corresponds to a number of virtual nodes of the reservoir computer and M is a number of time steps of time interval T; receiving a trained weight matrix, wherein the trained weight matrix is trained by linear regression; and multiplying the MEMS deflection matrix by the trained weight matrix to generate an output signal, wherein the output signal comprises an output of the reservoir computer that classifies the input signal.

In some embodiments, modulating the input signal comprises: receiving the input signal; sampling the input signal to generate a discretized input signal; receiving a weight mask with randomly generated values; and multiplying the discretized input signal with the weight mask to generate the modulated input signal.

In some embodiments, the MEMS deflection signal corresponds to a first time point, and generating the MEMS deflection signal comprises: for a second MEMS deflection signal corresponding to a second time point that is before the first time point, applying a delay to the second MEMS deflection signal to generate a delayed second MEMS deflection signal; applying a feedback gain operator the delayed second MEMS deflection signal; and modulating the delayed second MEMS deflection signal with the modulated input signal to generate the MEMS deflection signal corresponding to the first time point.

In some embodiments, the modulated input signal provides input to individual nodes of a reservoir of N nodes of the reservoir computer, and the MEMS deflection signal corresponds to an output of the reservoir of the reservoir computer.

BRIEF DESCRIPTION OF THE DRAWINGS

FIG. 4 shows the velocity of the MEMS device: (panel (a)) in a leaking vacuum chamber, and (panel (b)) when the pump is on (under the influence of periodic pump noise), in accordance with some embodiments.

DETAILED DESCRIPTION

Figure 1:
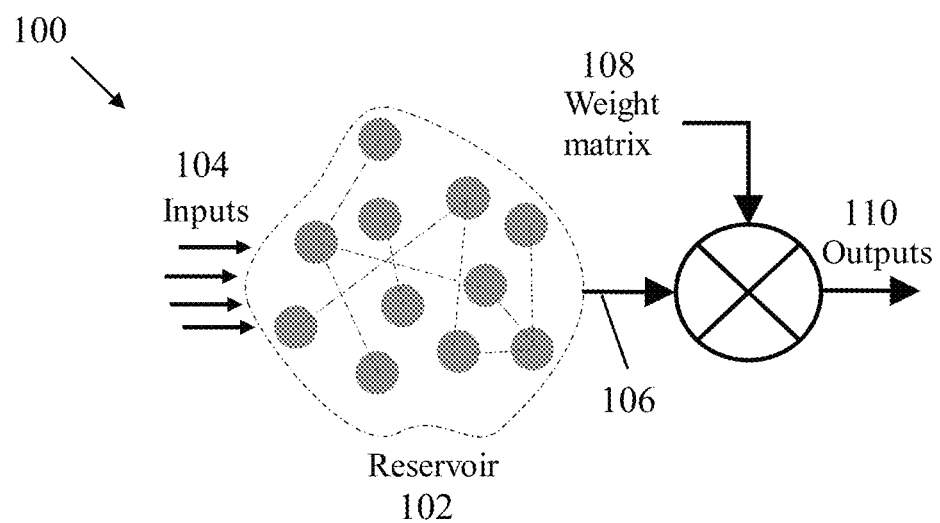
FIG. 1 illustrates a reservoir computing (RC) approach, according to one embodiment.

The disclosure provides, in some embodiments, a sensing and computing scheme using micro-electro-mechanical-systems (MEMS) devices, e.g., MEMS sensors, capable of performing a computational task (e.g., classification) at the sensor node to offload the central processor. This technology enables complex computation using simple digital computing schemes and can be used in wearable electronics and edge computation.

In some embodiments, using a MEMS device as a continuous model inherently exhibits multiple degrees of freedom, compared to a limited single degree of freedom (SDoF) model, allowing a single MEMS device to sustain multiple reservoir states simultaneously. In embodiments, virtual neurons may be generated using a modulated electrical biasing signal.

As described in greater detail herein, some embodiments of the disclosure present an approach to delay-based reservoir computing (RC) without input modulation. Some embodiments employ a modulated bias to maintain transience, while utilizing either an electrical signal or an environmental signal (such as acceleration, for example) as an unmodulated input signal. The proposed approach enables RC carried out by sufficiently nonlinear sensory elements, such as using a single micro-electro-mechanical-system (MEMS) device. According to some embodiments, the MEMS device can perform co-localized sensing and computing with fewer electronics than traditional RC elements (such as analog-to-digital and digital-to-analog converters).

Advantageously, the disclosed embodiments save on computational resources by offloading computations from a central processor. The disclosed embodiments are also cheaper than conventional artificial intelligence (AI) devices, since just a single MEMS device is used, without complex analog-to-digital or digital-to-analog converters. The disclosed embodiments are flexible, in that the electrical signal can be freely controlled to produce the desired signal.

Sensing and processing complex time-series data, such as human inertial data in real-time using wearable devices, holds great potential for advancing medical diagnostic and treatment procedures. Currently, however, the processing of time-series data using conventional neural networks requires pre-processing to extract features, which is a complex and time-consuming task. Deep neural networks perform feature extraction and processing simultaneously. However, these types of systems are prohibitively more complex to train and require significantly higher computational power than is available in wearable devices.

Some embodiments of the present disclosure address the above concerns by utilizing reservoir computing (RC), trained by a simple linear regression method, to directly perform time-series analysis. Reservoir computing (RC) is a framework for computation derived from recurrent neural network theory that maps input signals into higher dimensional computational spaces through the dynamics of a fixed, non-linear system called a reservoir. After the input signal is fed into the reservoir, which is treated as a "black box," a simple readout mechanism is trained to read the state of the reservoir and map it to the desired output. Like a human brain, RC relies on large networks of recurrent neurons to perform computations. In RC, only those useful trajectories are amplified by rewiring the network connections through learning and not useful trajectories are suppressed.

Some embodiments of the disclosure provide a novel physical RC approach that benefits from the distributed and complex modal interactions of continuous micro-electromechanical systems (MEMS) structures to reduce the network size by an order of magnitude while maintaining high computation speed and performing sensing simultaneously.

Another limitation of current sensing technology is the current implementation of the modal sensor approach. In the modal sensor approach, signals from multiple sensors are preprocessed individually and then combined and analyzed, usually by a machine-learning algorithm in a digital computer, to provide high-level information. However, the modal sensor approach imposes multiple challenges, such as sensor selectivity issues, the requirement for different types of sensor readouts, and the need for processing units with high power consumption to perform computing. Embodiments of the disclosure address these concerns by providing a dynamic approach to simultaneously respond to multiple measurements of interest with MEMS-based reservoir computing, thus addressing limitations of the current implementation of a modal sensor approach.

While the proposed MEMS-based RC device can be trained to tackle many applications, some non-limiting examples are: (1) detecting and classifying human gait signatures for patients with Peripheral artery disease (PAD), and (2) modeling human thermal comfort through a novel modal sensor approach.

In the age of the internet of things (IoT), processors are expected to perform complex computational processes on large amounts of data in real time. These computational processes, such as classification, clustering, and image processing, are conventionally performed through artificial neural networks (ANN), simulated using digital computers. While successful in some of these tasks, ANNs react to each of their inputs separately without considering the inputs past values.

Recurrent neural networks (RNNs) are networks that incorporate memory in ANNs by altering ANNs from functions to dynamical systems, where the current state is influenced by the network inputs and the network past states. While RNNs offer the benefit of implementing co-localized memory and computation in the system, they are much harder to train than simple ANNs. This complexity arises from the bifurcations in the system due to parameter changes in training and the ineffectiveness of the gradient descent method in systems with long-term dependencies.

Reservoir computing (RC) was introduced as a way to utilize RNNs while bypassing the training dilemma of RNNs.

FIG. 1 illustrates a reservoir computing (RC) approach, according to one embodiment. A reservoir computer (RC) 100 is composed of a network of interconnected nonlinear neurons (like RNNs) called a reservoir 102. The neurons in the reservoir 102 are coupled through random coupling weights. Using the reservoir 102 of neurons, inputs 104 are nonlinearly transformed via the reservoir 102 into higher dimensional space to produce the reservoir output signal 106. In some embodiments, the reservoir output signal 106 is a vector. The vector is then multiplied by a weight matrix 108 to produce an RC system output 110. The nonlinear transformation within the reservoir 102 offers great nonlinear richness in the reservoir computer 100 and can be used for computational problems, such as characterization or classification. Because of this dynamical richness, RCs 100 are much easier to train than classical RNNs, as the only weights in need of training in the system are located in the external weight matrix 108, which can be trained by simple linear regression.

Classical RCs have found great success as approximators of chaotic systems and as biologically-inspired controllers in insect inspired robots. However, despite their great potential, reservoir computers are computationally expensive to simulate, due to the large number of nonlinear components in the reservoir.

Some of the disclosed embodiments solve this problem by introducing a reservoir of virtual nodes using a single dynamical device, such as a MEMS resonator. As disclosed herein, one implementation utilizes an electrostatic MEMS device to simulate the response of a $10^{th}$ order nonlinear auto-regressive moving average (NARMA10) to demonstrate the potential of MEMS reservoirs as dynamical system approximators.

Reservoir Computing

As described and shown in FIG. 1, a reservoir computing architecture is composed of an input signal 104, a reservoir 102 of nonlinear nodes with random connection weights, and a tunable output interface, i.e., reservoir output signal 106 tunable by the weight matrix 108. When the eigenvalues of the random connection weights of the reservoir 102 are below unity, the interaction between the nodes retains complexity while remaining bounded. As such, the input signal 104 to the reservoir 102 is projected into a higher-dimensional space, enabling computation.

Figure 2:
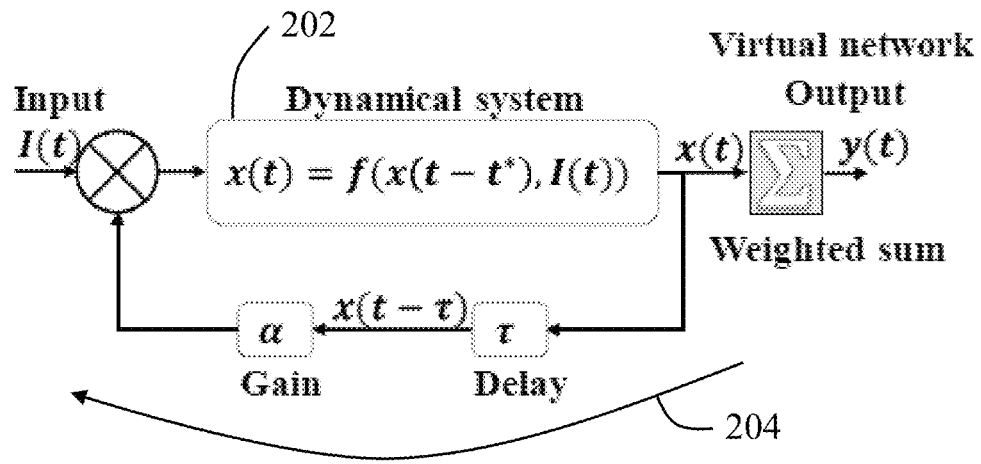
FIG. 2 illustrates a delay-based reservoir computing (RC) approach, according to one embodiment.

FIG. 2 illustrates a delay-based reservoir computing (RC) approach, according to one embodiment. Delay-based RC replaces the physical reservoir (such as reservoir 102 in FIG. 1) by a dynamical system 202 coupled within a delay-based feedback loop 204. In this approach, instead of physical nodes, the dynamical system 202 represents a network of N coupled virtual nonlinear nodes in time, at which the state of the dynamical system 202 at a specific time step θ represents a virtual node. A virtual node is coupled to its preceding nodes due to the dependency of the dynamical system 202 on previous time states. Self-coupling is also enabled through delayed feedback of a gain α and a time delay t=Nθ, which effectively produces a lower triangular adjacency matrix in the system.

Figure 3:
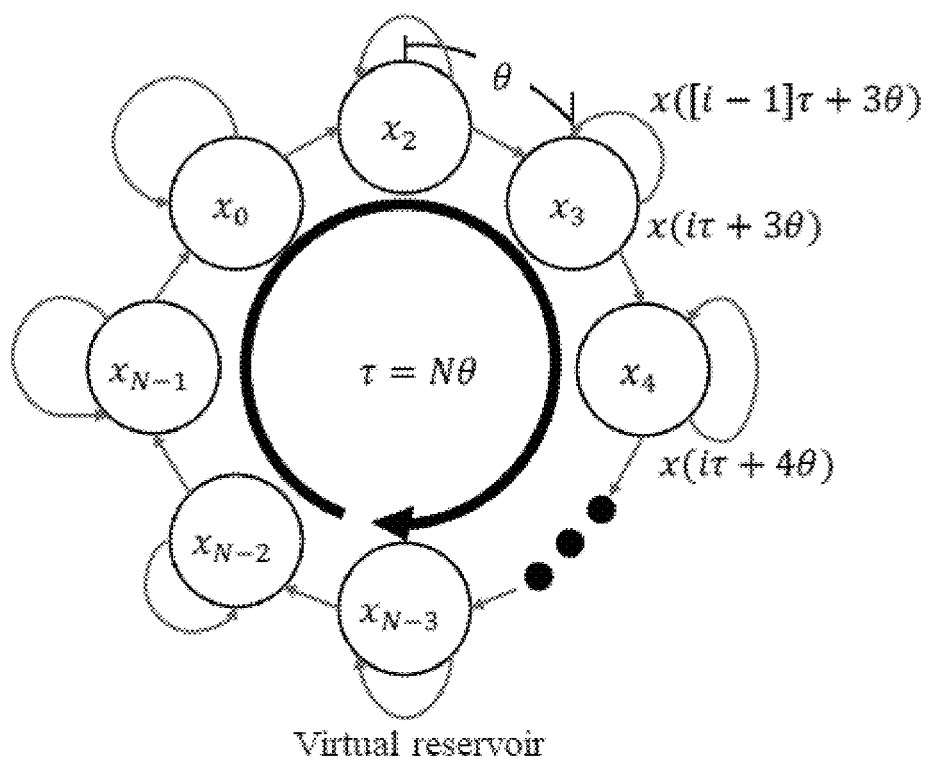
FIG. 3 illustrates the virtual reservoir produced from delayed-feedback and system dynamics of a delay-based reservoir computing (RC) approach, according to one embodiment.

FIG. 3 illustrates the virtual reservoir produced from delayed-feedback and system dynamics of a delay-based reservoir computing (RC) approach, according to one embodiment. The RC response of the system can be represented using a states matrix notion X, as follows:

$$X_{i,j} = x_j(i) = x((i-1)\tau + j\theta), i=1,2,\ldots,T, j=0,1,\ldots,N-1 \quad \text{(Eq. 1)}$$

High coupling between the virtual nodes is achieved by retaining the dynamical system transience through input time-multiplexing. In one embodiment, time multiplexing can be performed using a sequence of analog-to-digital conversion, sampling-and-holding (for the duration of t), and masking. Therefore, the reservoir input signal is given by:

$$J^*(t) = w_j \times I((i-1)\tau), (i-1)\tau + j\theta \leq t < (i-1)\tau + (j+1)\theta, i=1,\ldots, T, j=0,\ldots,N-1 \quad \text{(Eq. 2)}$$

where J*(t) is the modulated input signal for the reservoir, $w_j$ is a periodic (period t) mask with alternating values (for example, 0.3 and 1) every θ increment, and 1(t) is the reservoir input at time t. In one embodiment, the input signal is assumed to be electrical to enable pre-processing. In another embodiment, the input signal may also originate from a physical quantity that is measured by a sensor, thus separating the sensing and computing node.

The output of the delay-based RC is calculated by utilizing an output weight matrix $W_o$ optimized through linear regression to generate the output Y* that is updated at intervals of t when all virtual nodes are processed using:

$$Y^* = X \times W_o \quad \text{(Eq. 3)}$$

where Y* is the calculated output vector:

$$Y^* = [y_1^*, y_2^* \ldots, y_T^*] \text{ and } y_i^* = y^*(i\tau), i=1,2,\ldots,T \quad \text{(Eq. 4)}$$

In various embodiments, the weight vector can be simply trained using linear regression, or other simple regression methods, such as Ridge regression (i.e., Ridge regression can be computed by $W_o = (X^T X + k \times I)^{-1} X^T Y$).

Micro-Electro-Mechanical-System Dynamics

As described herein, embodiments of the disclosure provide a MEMS-based reservoir computer (RC) architecture that can perform sensing and computing co-locally, which bypasses the complexity inherent in traditional RC of separating the sensing layer and computing layer. The MEMS device used in various embodiments of the disclosure can take on many different configurations. Some non-limiting examples examples include a parallel plate electrostatic MEMS device or an arched MEMS device.

Figure 4A:
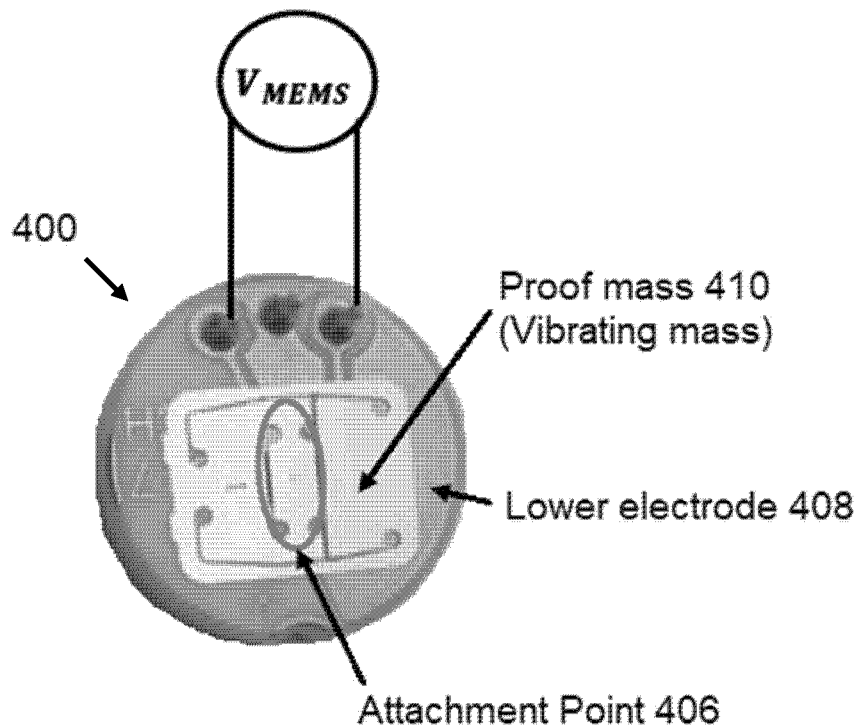
FIGS. 4A-4C illustrate a double-cantilever, electrostatically-actuated MEMS accelerometer, according to one embodiment.
Figure 4B:
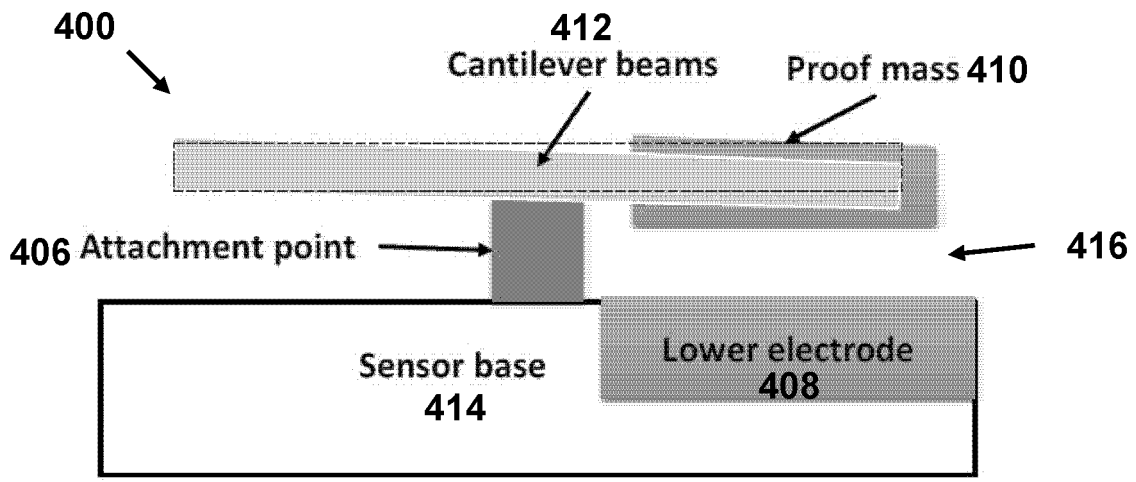
Figure 4C:
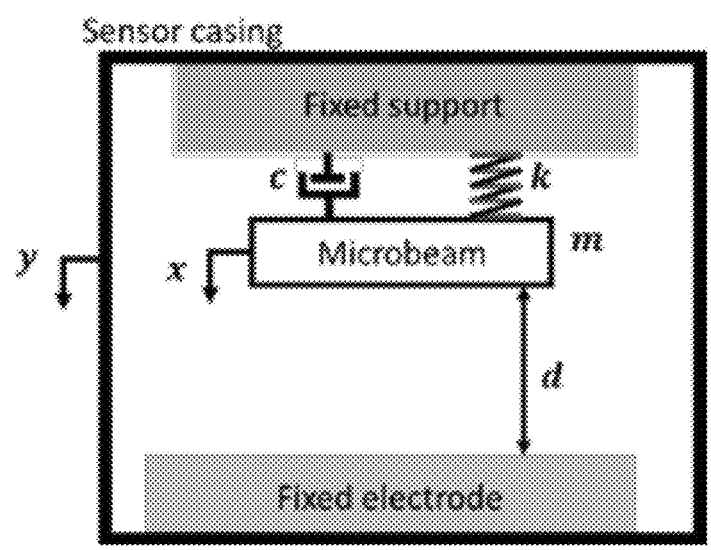

FIGS. 4A-4C illustrate a double-cantilever, electrostatically-actuated MEMS accelerometer, according to one embodiment. As described herein, a MEMS device is used as part of the disclosed reservoir computing scheme.

FIG. 4A is an image of a MEMS device 400, according to one embodiment. FIG. 4B is a block diagram illustrating schematics of a side view of the MEMS device 400, according to one embodiment. The MEMS device 400 includes a sensor base 414 including a lower electrode 408. An attachment point 406 is disposed between the sensor base 414 and cantilever beams 412. A proof mass 410, e.g., a vibrating mass, is disposed on the cantilever beams 412. An electrostatic gap 416 is thereby formed between the proof mass 410 and the lower electrode 408. $V_{MEMS}$ is an electrical voltage signal applied to the MEMS device 400.

FIG. 4C is a block diagram of a single-degree of freedom model of the MEMS device 400, according to one embodiment. In some embodiments, the dynamics of the MEMS device 400 can be simplified as a single-degree of freedom (SDF) of a spring-mass-damper system as shown in FIG. 4C and is governed by:

$$\ddot{z}(t) + 2\zeta(2\pi f_n)\dot{z}(t) + (2\pi f_n)^2 z(t) = \frac{\varepsilon A(V_{MEMS})^2}{2m_{eff}(d-z)^2} - \ddot{y}(t) \quad \text{(Eq. 5)}$$

where z(t)=x(t)−y(t) is the relative displacement of the MEMS microbeam x(t) with respect to the motion of the base y(t) displacement at time t, fn is the natural frequency, $\zeta$ is the damping ratio, $\varepsilon$ is the electrical permittivity, A is the MEMS surface area, $V_{MEMS}$ is the electrical voltage signal applied to the MEMS device 400 and is usually made of a bias constant voltage $V_b$ imposed with an AC (alternating current) voltage $V_{AC}$, $M_{eff}$ is the effective MEMS mass, d is the nominal separation distance between the MEMS electrodes, and the dot operator represents temporal derivative. In one embodiment, $c=2\zeta m_{eff}(2\pi f_n)$ is the damping constant, and $k=(2\pi f_n)^2 m_{eff}$ is the linear stiffness of the MEMS device.

The dimensions of an example MEMS device are given in Table 1.

TABLE 1

MEMS parameters

| Parameter | Physical meaning | Value | |
|---|---|---|---|
| $\zeta$ | Damping constant (in a vacuum) | $3 \times 10^{-3}$ | |
| $f_n$ | MEMS natural frequency | 195.3 | Hz |
| $\varepsilon$ | Electrical permittivity | $8.85 \times 10^{-12}$ | F/m |
| A | MEMS surface area | 39.6 | mm² |
| d | Nominal separation gap between moving and fixed electrodes | 42 | μm |
| $m_{eff}$ | Effective MEMS mass | 106 | mg |

While the dimensions in the example in Table 1 are relatively large, the MEMS device still exhibits the same dynamics as smaller MEMS devices due to the micro-scale d.

As described in greater detail below, virtual nodes of a MEMS reservoir are represented by the state of the MEMS device z(t), which can be attained using the example experimental apparatus as shown below in FIG. 18.

Parallel Plate Electrostatic MEMS Device

Figure 5:
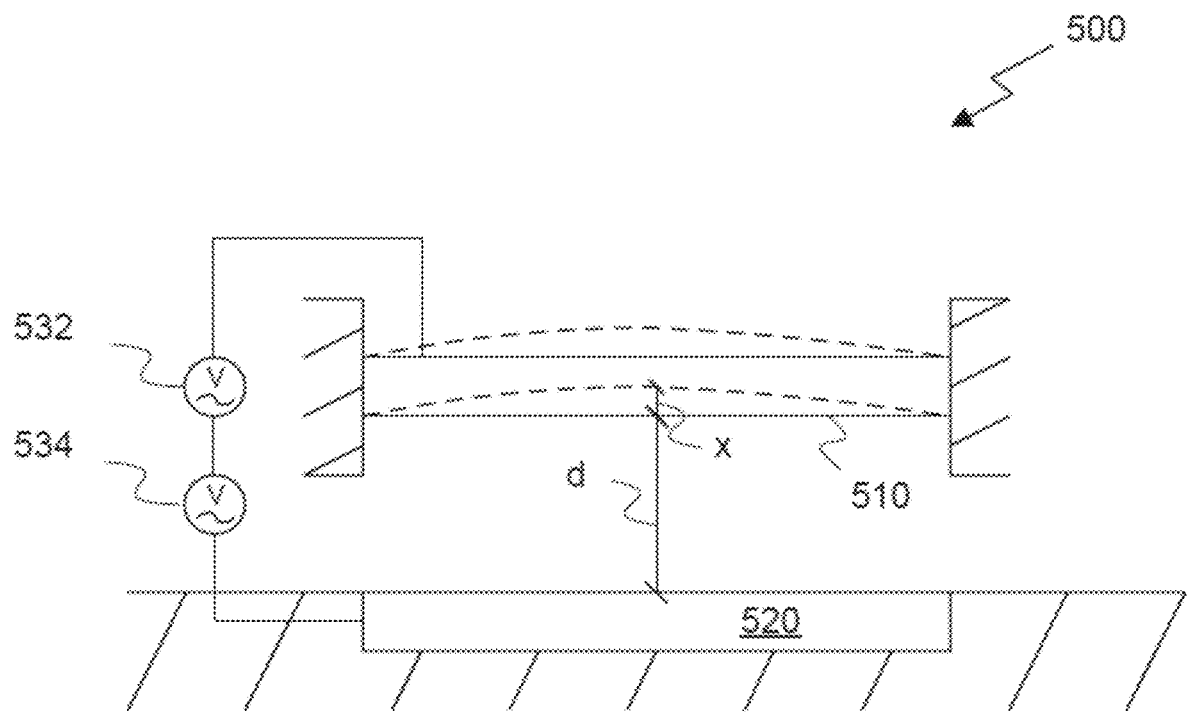
FIG. 5 illustrates a parallel plate electrostatic MEMS device, in accordance with some embodiments.

FIG. 5 illustrates a parallel plate electrostatic MEMS device 500, in accordance with some embodiments. As depicted in FIG. 5, the MEMS device 500 includes a microbeam 510 with fixed ends disposed over a stationary electrode 520. Voltage sources 532, 534 can create a charge on the microbeam 510 and a corresponding charge on the stationary electrode 520. The structure is equivalent to a parallel-plate capacitor with a nominal air-gap of width d between the plates, and the charges on the plates can create a force along the microbeam 510 that generates a deflection of the microbeam 510 having magnitude, x. The electrostatic force due to the charge will cause the microbeam to flex towards the electrode 520.

In an embodiment, the voltage source 532 provides a DC voltage that acts as a bias voltage and the voltage source 534 provides an AC voltage that causes a periodic change in the electrostatic force experienced by the microbeam 510. The MEMS device 500 can be modeled as shown in Equation 6:

$$m_{eff}\ddot{x}+c(x)\dot{x}+kx=F_e, \quad \text{(Eq. 6)}$$

where c(x) is a nonlinear squeeze film damping, k is a linear stiffness coefficient, x(t) is the out of plane position, $F_e$ is the electrostatic force, and $m_{eff}$ is the effective mass of the microbeam 510. The electrostatic force $F_e$ acting on the MEMS device 500, ignoring the fringe fields between the microbeam 510 and the electrode 520, is governed by Equation 7:

$$F_e = \frac{\varepsilon A_s V_{MEMS}^2}{2(d-x)^2}, \quad \text{(Eq. 7)}$$

where $\varepsilon$ is the permittivity constant, $A_S$ is the overlapping surface area between the microbeam 510 and the electrode 520, $V_{MEMS}$ is the voltage across the MEMS device, and d is the nominal gap between the microbeam 510 and the electrode 520. The parallel plate capacitance of the MEMS device 500 is given by Equation 8:

$$C_{MEMS} = \frac{\varepsilon A_s}{d-x} \quad \text{(Eq. 8)}$$

In the MEMS device 500 of FIG. 5, the microbeam 510 is biased by a DC electrostatic load, $V_{DC}$. The DC voltage deflects the microbeam 510 toward the electrode 520, and there is an upper limit for the DC voltage, beyond which the mechanical restoring force is unable to overcome the opposing electrostatic force. This leads to a collapse of the structure, which can be referred to as the pull-in instability. This nonlinear instability can be explained by a saddle-node bifurcation in a potential energy plot of the MEMS device 500 where no fixed point exists after the unstable solution destroys the stable solution. Typical operation of the MEMS device 500 does not allow for bi-stable states; however, the electrical properties of a circuit that includes the MEMS device can be used to create electro-mechanical feedback that enables bi-stability.

Figure 6:
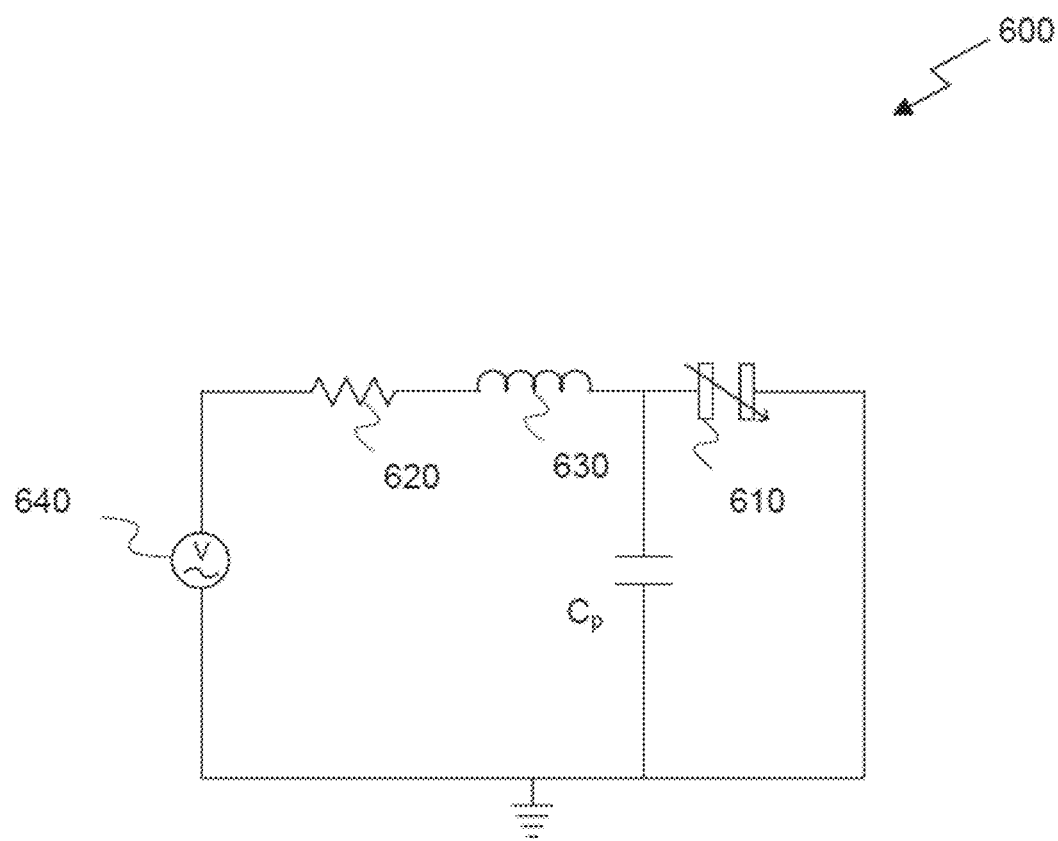
FIG. 6 illustrates an electrical circuit that includes a MEMS device, in accordance with some embodiments.

FIG. 6 illustrates an electrical circuit 600 that includes a MEMS device 610, in accordance with some embodiments. The MEMS device 610 can be a cantilever beam MEMS device, which can be modeled as a spring-mass-damper mechanical system as well as a capacitor due to the charge between an electrode and the surface of the cantilever beam. The cantilever beam MEMS device 610 is similar to the MEMS device 500 of FIG. 5, except only one end of the microbeam 510 is fixed relative to the surface of the electrode 520.

As depicted in FIG. 6, the electrical circuit 600 is a simple RLC circuit that includes a resistor 620, an inductor 630, and the MEMS device 610 (acting as a capacitor). The MEMS device 610 can also be associated with a parasitic capacitance, $C_p$, due to the electrical connections between the circuit and the components of the MEMS device 610.

The electrical circuit is connected to a voltage source 640. The resistor 620 can be a combined resistance due to the internal impedance of the voltage source 640 as well as the impedance of the interconnects used to connect the voltage source 640 to the inductor 630 and/or MEMS device 610.

The MEMS device 610 has a mechanical resonance frequency $\omega_m$ based on the physical arrangement of components and an electrical resonance frequency $\omega_e$ based on the electrical characteristics of the RLC circuit. More specifically, any charge on the surface of the electrode and the surface of the cantilever microbeam results in a force acting on the cantilever microbeam of the MEMS device 610 that causes a deflection of the cantilever microbeam. The deflection of the microbeam in the presence of a continuously changing force due to the electrical field created by the charge is characterized in accordance with the physical structure of the microbeam, including the dimensions of the microbeam, the material the microbeam is constructed of, and so forth. The distribution of mass throughout the structure of the microbeam as well as the material properties such as Young's modulus of elasticity dictate the mechanical resonance frequency such that an AC voltage supplied to the MEMS device 610 causes a corresponding periodic deflection of the microbeam. As the frequency of the AC voltage increases towards the mechanical resonance frequency, the peak amplitude of the deflection increases in accordance with a gain associated with the mechanical resonance frequency and has a maximum amplitude at the mechanical resonance frequency.

As the frequency of the AC voltage moves past the mechanical resonance frequency, the peak amplitude of the deflection is attenuated such that, as the frequency of the AC voltage approaches the electrical resonance frequency, the deflection of the microbeam of the MEMS device 610 is quasi-static and has a magnitude that corresponds with an effective DC voltage of the AC input signal that is amplified due to the resonant response. A gain associated with the frequency of the AC voltage can be calculated by comparing a ratio of the effective DC voltage to the root-mean-squared value of the AC voltage. The effective DC voltage refers to the DC voltage that would cause the same deflection in the cantilever microbeam. Common values for the gain associated with the frequency response proximate the electrical resonance frequency can be greater than 5 and in some cases over 20 (e.g., 26). In an embodiment, the electrical circuit 600 is configured such that a gain at the electrical resonance frequency is at least 20 decibels (e.g., a gain of 10). It will also be appreciated that the electrical resonance frequency is significantly higher than the mechanical resonance frequency (e.g., 10 kHz compared to 200 Hz) such that the MEMS device 610 response to an electrical excitation signal having a frequency proximate the electrical resonance frequency is quasi-static.

Bi-stability is introduced by exciting the MEMS device 610 with an AC voltage at a frequency proximate the electrical resonance frequency of the circuit through the following cycle: (1) the MEMS deflection increases due to voltage amplification at resonance, (2) the capacitance of the MEMS device changes, (3) the electrical resonance frequency shifts, (4) the voltage amplification across the MEMS parallel plate reduces, and (5) the cycle repeats until the MEMS may reach another stable position. The sigmoid-like function due to electrical resonance is as follows:

$$g(x) = \frac{V(\beta(x)-1)}{\beta(x)}, \quad \text{(Eq. 9)}$$

where β is the electrical resonance amplification gain, which is a function of the circuit electrical damping condition, the deflection of the MEMS device, and the difference between the input voltage frequency and the electrical resonance frequency.

In an exemplary embodiment, the physical properties of the MEMS device 610 are as follows: a length of the microbeam is 9 mm, a width of the microbeam is 5.32 mm, a thickness of the microbeam is 150 μm, an initial gap between the microbeam and the stationary electrode is 42 μm, and a linear stiffness of the microbeam is 215 N/m. This results in a primary mechanical resonance frequency of 195 Hz. The electrical resonance frequency, in radians per second, of the electrical circuit 500 is given as the inverse of the square root of the inductance L multiplied by the capacitance C. Given a value of 10 pF for the variable capacitance of the MEMS device 510 and an inductance of 27 mH, the electrical resonance is approximately 9.7 kHz based on the conversion of 1 Hz equal to 2π rad/sec. It will be appreciated that the actual electrical resonance frequency can depend significantly on the parasitic capacitance and parasitic resistance of the electrical circuit caused by the interconnections made between the various components of the electrical circuit as well as the internal resistance of the voltage source, and the like. Consequently actual electrical resonance frequencies of the electrical circuit can be higher than 10 kHz (e.g., 60 kHz). Furthermore, the bandwidth of the frequency response depends on the value of the resistance R as higher resistance results in lower signal gain but wider bandwidth.

Arched MEMS Device

In the embodiments described above, bi-stability of the MEMS device 610 is enabled by exciting the MEMS device 610 with an AC voltage at a frequency proximate the electrical resonance frequency of the circuit. Bi-stability can be useful, for example, to simulate the neurological behavior of a CTRN neuron. However, this bi-stability characteristic is also inherently present in some specific MEMS device structures, such as an arched MEMS device.

Figure 7:
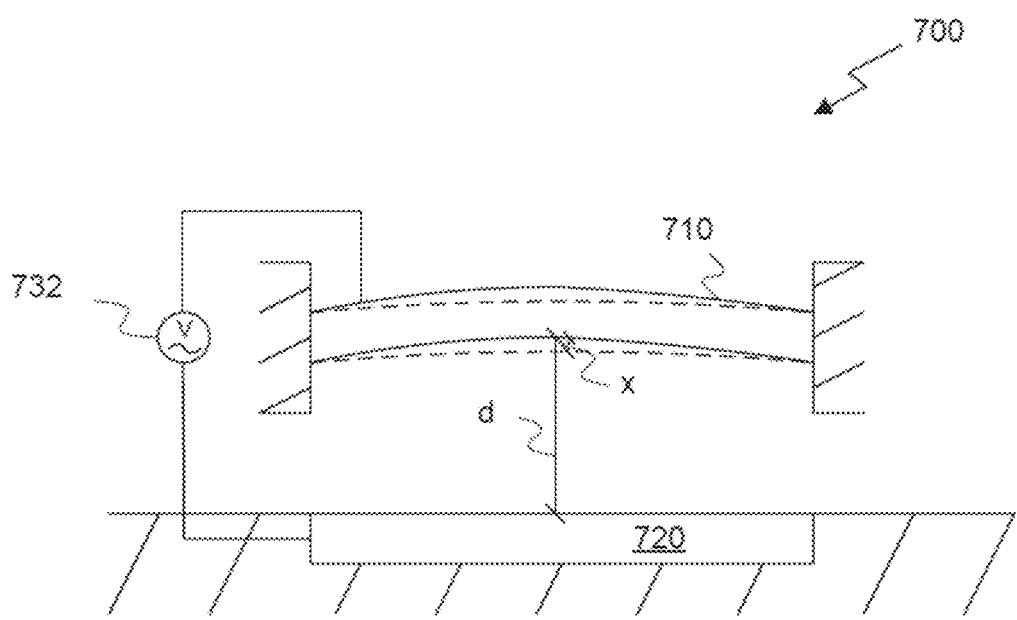
FIG. 7 illustrates a MEMS device, in accordance with some embodiments.

FIG. 7 illustrates a MEMS device 700, in accordance with some embodiments. As depicted in FIG. 7, the MEMS device 700 includes an arched microbeam 710 positioned above a stationary electrode 720. The MEMS device 700 differs from the MEMS device 500 because the relaxed state of the microbeam 710 is arched rather than straight. The MEMS device 700 can also be excited by one or more voltage sources 732. In an embodiment, a single DC voltage source 732 is coupled to the MEMS device 700. Assuming that the arched microbeam 710 is under no axial load, the dynamics of the MEMS device 700 can be modeled according to Equation 10:

$$\frac{3\rho L A_{cs}}{8}\ddot{x} + \frac{3Lc}{8}\dot{x} + \frac{2\pi^4 EI}{L^3}(x+b_0) + \frac{\pi^4 E A_{cs}^2}{8L^3}(x^2-b_0^2)x = \frac{\varepsilon A_s V_{MEMS}^2}{4\sqrt{d(d-x)^3}}, \quad \text{(Eq. 10)}$$

where ρ is the mass density of the arched microbeam 710, L is the length of the ached microbeam 710, $A_{CS}$ is the cross-sectional area of the arched microbeam 710, x is the deflection from the equilibrium point (positive away from the electrode 720), c is the damping coefficient, E is Young's modulus of elasticity, I is the second moment of area of a straight microbeam with similar dimensions around the neutral axis of the arched microbeam 710, $b_0$ is the initial curvature, and $A_S$ is the surface area.

Assuming high damping, the first term associated with acceleration $\ddot{x}$ can be dropped and Equation 10 can be simplified to take the form of Equation 11:

$$\tau\dot{x}=-x+h_n+C_n g(x)+\Gamma(x,V_a+V_0), \quad \text{(Eq. 11)}$$

where $C_n$ is the ratio of the cubic non-linear stiffness, $k_3$, to the linear stiffness, $k_1$. The following set of equations define the parameters for Equation 11:

$$\sigma = \frac{c}{\rho A} \quad \text{(Eq. 12)}$$

$$\omega_{m1} = 22.3733\sqrt{\frac{EI}{\rho A_{cs} L^4}} \quad \text{(Eq. 13)}$$

$$k^* = \frac{16\pi^4}{1502}\frac{\omega_{m1}^2}{\sigma^2} \quad \text{(Eq. 14)}$$

$$k_1 = k^* - b_0^2 k_3 \quad \text{(Eq. 15)}$$

$$k_3 = 0.065 b_0^2 \frac{A_{cs}}{I}\frac{\omega_{m1}^2}{k_1} \quad \text{(Eq. 16)}$$

$$\tau = \frac{\sigma}{k_1} \quad \text{(Eq. 17)}$$

$$h_n = 1.03786\frac{h\omega_{m1}^2}{\sigma^2 g_0 k_1} \quad \text{(Eq. 18)}$$

$$C_n = -\frac{k_3}{k_1} \quad \text{(Eq. 19)}$$

$$\Gamma(x,V) = \frac{2\varepsilon b V^2}{3\rho A_{cs}\sqrt{d(d+x)^3}} \quad \text{(Eq. 20)}$$

$$s(x,t) = \frac{\Gamma(x,V_a)}{k_1} \quad \text{(Eq. 21)}$$

$$g(x) = x^3 \quad \text{(Eq. 22)}$$

In an example embodiment, the MEMS device 700 is configured to include an arched microbeam 710 with a length, L, equal to 1000 μm, a width, b, equal to 30 μm, and a thickness, h, equal to 3 μm. The initial gap, d, is equal to 10.1 um, the mass density, p, is equal to 2330 kg/m³, a Young's modulus of 160 GPa, and a Poisson's ratio of 0.22. The initial curvature, $b_0$, is equal to 3 μm. During operation, detection instability occurs when the input voltage exceeds a snap-through threshold voltage, $V_f$, and reverse detection instability occurs when the input voltage drops below a release threshold voltage, $V_b$. Thus, by exciting the MEMS device 700 with an input voltage over the snap-through threshold voltage the MEMS device 700 moves from an OFF state to an ON state. The ON state is maintained until the input voltage drops below the release threshold voltage, which is less than the snap-through threshold voltage, thereby introducing a hysteresis during operation. These characteristics resemble a selection behavior for a single DFT neuron rate-model.

In some embodiments, the operation of the MEMS device 700 can exhibit memory behavior instead of selection behavior. To exhibit a memory behavior, the MEMS device 700 is biased with a bias voltage. The bias voltage will be more than the release threshold voltage but less than the snap-through threshold voltage. Once the MEMS device 700 is excited by an additional input voltage that, when combined with the bias voltage, exceeds the snap-through threshold voltage, the MEMS device 700 moves from the OFF state to the ON state. As the input voltage is reduced back to zero, the bias voltage remains above the release threshold voltage and the MEMS device 700 remains in the ON state.

It will be appreciated that solving Equation 10 using a conventional, CMOS-based logic device may require between 5 and 1200 floating point calculations compared to the analog operation of the MEMS device 700. In addition, the MEMS device 700 may be up to 10 times as efficient, from a power consumption standpoint, compared to the CMOS-based logic device. Consequently, a system that incorporates a number of MEMS device 700 to implement a reservoir computer can save significant power as well as perform the processing at much faster speeds than comparable digital, CMOS-based logic devices.

MEMS Reservoir Computing

In one implementation, the traditional approach of input time-multiplexing can work to provide a MEMS-based reservoir computer (i.e., pure computing) by modulating the input AC voltage signal. This approach, however, may be inappropriate for the disclosed novel MEMS reservoir computing device for simultaneous sensing and computing, where the input to the device is non-electrical in nature (e.g., acceleration, force, temperature, etc.) that cannot be modulated. To overcome this challenge, some disclosed embodiments instead modulate the bias voltage as follows:

$$J(t)=w_j \times V_b, (i-1)\tau+j\theta \le t < (i-1)\tau+(j+1)\theta, i=1,\ldots,T, j=0, \ldots, N-1 \quad \text{(Eq. 23)}$$

While the bias time-multiplexed signal (BTM) is supplied to ensure the MEMS device remains in transience to facilitate node coupling, which occurs when $\theta < 1/(2\pi\zeta f_n)$, it also improves the performance of the RC by eliminating the need for sample-and-hold circuits and analog-to-digital conversion, which are otherwise necessary for input multiplexing in traditional delay-based RC. The disclosed embodiments, thus, reduce the size and power consumption of the RC unit.

The response of the virtual nodes in the MEMS reservoir is probed by measuring the relative MEMS deflection z(t) at θ intervals to construct the virtual states X matrix from Eq. 1 for the RC scheme. In some embodiments, probing is done slightly after the injection of the time modulation signal with a delay of δ to enable the MEMS device to respond to the new input.

Reservoir of Virtual Nodes

In some embodiments, RC reservoirs may be formed using a single nonlinear dynamical system by creating temporal virtual nodes rather than physical nodes. In some embodiments, the network is configured to modulate the input signal to actuate the temporal nodes, and utilize a delayed feedback to couple the temporal nodes.

Figure 8:
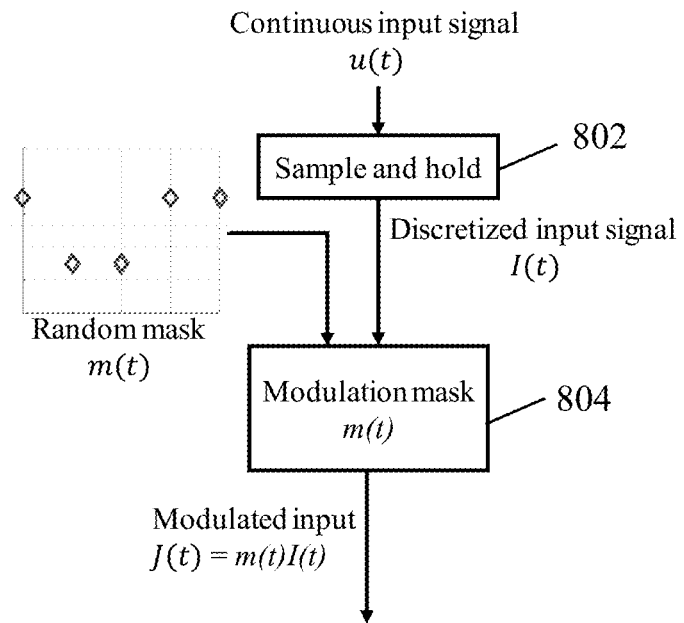
FIG. 8 illustrates a block diagram of an input state of the reservoir computing setup, according to one embodiment

FIG. 8 illustrates a block diagram of an input state of the reservoir computing setup, according to one embodiment. Modulating the input signal, u(t), is achieved through the following process. First, at 802, the input signal, u(t), is sampled and held with a sampling time T. The sample is held for time t. This produces the discretized input signal I(t). Next, at 804, at each T, the input is modulated using a randomly initialized weight mask m(t). The weight mask contains N weights, each related to a virtual node within the reservoir. The temporal separation between the random mask inputs is θ=T/N. The system should remain transient to maintain coupling between adjacent modes. Therefore, θ is chosen such that it is close to be lower than the system's time constant (or characteristic time), t. The discretized input signal is multiplied by the random weight mask, m(t) to produce the modulated input, J(t), which represents the input to the individual nodes.

Figure 9:
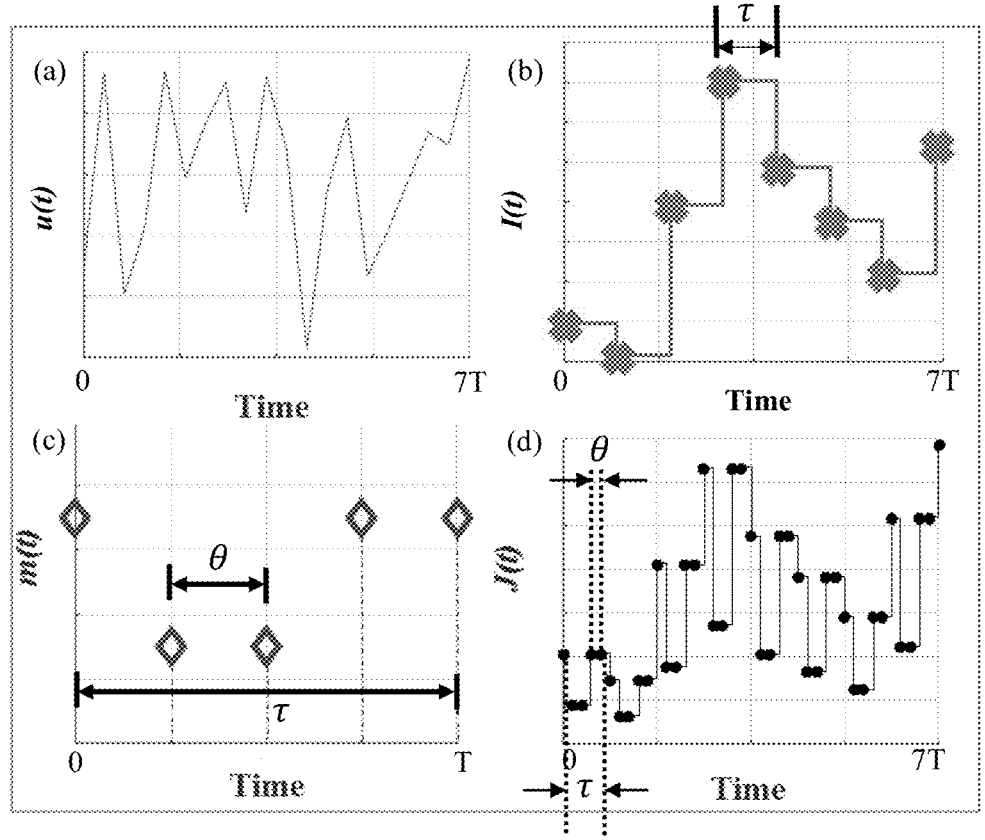
FIG. 9 is a circuit diagram of the signal transformations of FIG. 8, according to one embodiment.

FIG. 9 illustrates the signal transformations of FIG. 8, according to one embodiment. In FIG. 9, panel (a) shows the original signal (i.e., u(t) in FIG. 8), panel (b) shows the sampled input (i.e., I(t) in FIG. 8), panel (c) shows the modulation mask (i.e., m(t) in FIG. 8), and panel (d) shown the modulated input (i.e., J(t) in FIG. 8). Panel (b) shows that each sample is held for time t. In each sampling time t, there exists a number N of masking intervals θ. Panel (c) shows that the mask is periodic in t.

Figure 10:
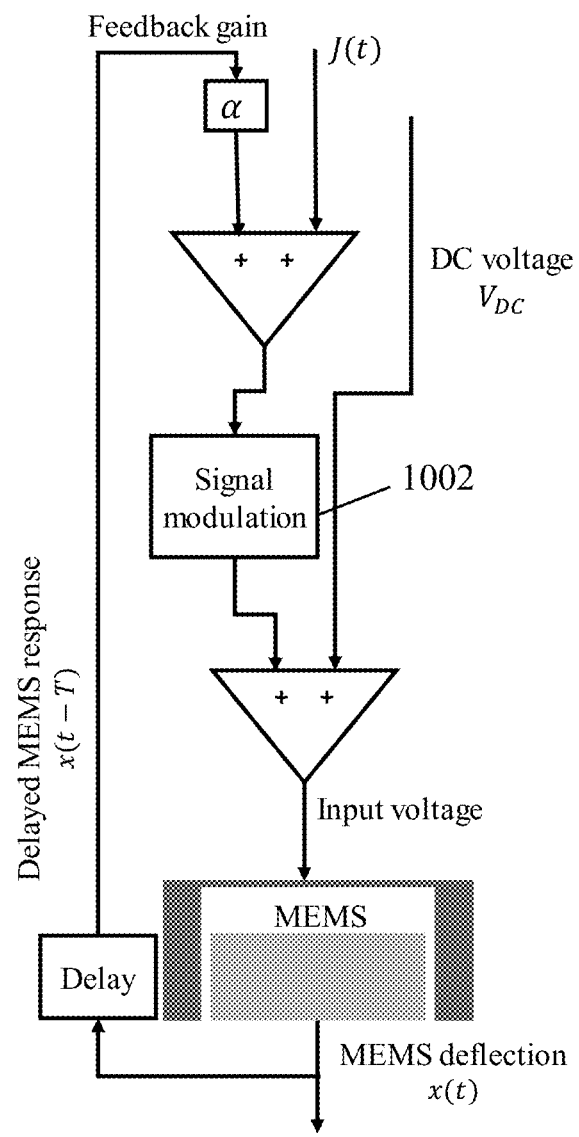
FIG. 10 illustrates the computational stage of the MEMS reservoir computing setup, according to one embodiment.

FIG. 10 illustrates the computational stage of the MEMS reservoir computing setup, according to one embodiment. The modulated input J(t) from FIG. 8 is used as a part of the MEMS driving signal within the computational stage of the RC scheme, as shown in FIG. 10. The MEMS deflection, x(t), represents the response of the reservoir. Because J(t) is modulated using a mask with a temporal separation of θs, the MEMS deflection at intervals multiple of θ represents the response of a temporal node with a total of N nodes distributed within a time span of T. The virtual nodes are coupled together using a delayed feedback in the system. Here, the MEMS deflection is delayed by T and multiplied by a feedback gain, α. The feedback offers interactions between the different MEMS nodes and offers additional memory for the system.

In various embodiments, the MEMS device may be driven quasi-statically, at or around the primary resonance or at secondary resonances. The signal modulator circuit 1002 in FIG. 10 is used to facilitate the use of the MEMS within the operational range. For instance, if the MEMS is desired to run at primary resonance, the signal modulation could be a frequency multiplier signal according to:

$$V_{AC}=A(1+\alpha x(t-\tau)+J(t)) \quad \text{(Eq. 24)}$$

where $V_{AC}$ is the overall AC amplitude due to the bias signal, feedback signal and modulated signal. A is the AC voltage amplitude. As also shown in FIG. 10, an additional DC signal can be used to ensure no frequency doubling in this setup.

Figure 11:
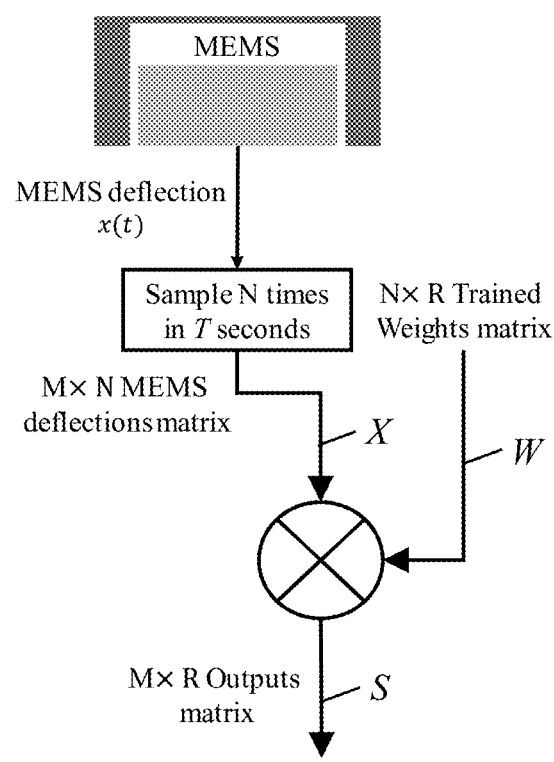
FIG. 11 illustrates the output stage of the MEMS reservoir computing setup, according to one embodiment.

FIG. 11 illustrates the output stage of the MEMS reservoir computing setup, according to one embodiment. After all inputs are processed, the deflections matrix X is formed by sampling the MEMS response, x(t), a rate of one sample per θ seconds in the output stage of the RC scheme. This matrix has a size M×N where N is the number of virtual nodes and M is the number of time steps.

The RC output matrix S (M×R) is produced by multiplying the deflection matrix and the weights matrix W according to:

$$S=XW \quad \text{(Eq. 25)}$$

Here, W is an N×R matrix and R is the number of outputs in the system. We note here that, for an appropriately large reservoir, W is the only matrix that requires training in the system. In some embodiments, W can simply be trained using linear regression, according to:

$$W=(X^TX+kI)^{-1}*(X^{-1}Y) \quad \text{(Eq. 26)}$$

where k≧0 is a constant, I=$\delta_{ij}$, i,j=1,2, . . . N is the identity matrix, Y is the expected output matrix with a size M×R and the $(.)^T$ operator is the transpose operator.

Benchmark Test: NARMA10

An example implementation of the disclosed MEMS reservoir computer is to model a common tenth order ($10^{th}$) discrete time NARMA (nonlinear auto-regressive moving average) dynamical system using a MEMS reservoir. A NARMA10 dynamical system is modelled using the equation:

$$y_{k+1}=0.3y_k+0.05y_k[\Sigma_{i=0}^{9}y_{k-i}]+1.5u_ku_{k-9}+0.1 \quad \text{(Eq. 27)}$$

where $y_k$ is the $k^{th}$ NARMA state and $U_k$ is the input at the $k^{th}$ time step. In some embodiments, u is chosen to be a random number such that $u_k \in [0,0.5]$. $y_k$ is complicated to fit due to the influence of past values on future responses, which makes this problem a compelling benchmark for nonlinear approximators.

In one implementation, a commercial double-cantilever electrostatic MEMS device is used to create the system reservoir. The parameters of this example MEMS device are found in Table 2 and a schematic of this MEMS is found in FIG. 4B.

TABLE 2

MEMS parameters

| Parameter | Value | Definition |
|---|---|---|
| L | 9000 μm | Microbeam length |
| b | 4400 μm | Microbeam width |
| $f_m$ | 192.5 Hz | MEMS mechanical resonance frequency |
| k | 215 N/m | Microbeam linear stiffness |
| d | 42 μm | Unactuated gap seperation |

The deflection of the MEMS device due to electrostatic forcing is given by:

$$m\ddot{x}(t)+c(x)\dot{x}(t)+kx(t)=\frac{\varepsilon LbV_{MEMS}^2}{2(d-x(t))^2} \quad \text{(Eq. 28)}$$

where x(t) is the MEMS deflection as a function of time (t), c(x) is the nonlinear squeeze film damping coefficient, ε is the vacuum permittivity and $V_{MEMS}$ is the voltage across the MEMS device, given by $$V_{MEMS}=V_{AC}\cos(2\pi ft)+V_{DC} \quad \text{(Eq. 29)}$$

where $V_{AC}$ is the amplitude of the AC voltage, given by (Eq. 24) in our example setup, f is the AC driving frequency and $V_{DC}$ is the DC voltage amplitude. The nonlinear squeeze film damping can be calculated using (Eq. 30) to (Eq. 34) by adapting the "Blech model":

$$\lambda_a=\lambda_0 P_0/P_a \quad \text{(Eq. 30)}$$

$$Kn=\lambda_a/d \quad \text{(Eq. 31)}$$

$$\eta_{eff}=\eta/(1+9.638Kn^{1.159}) \quad \text{(Eq. 32)}$$

$$\sigma(x)=\frac{12Lb\omega\eta_{eff}}{P_a(d-x)^2} \quad \text{(Eq. 33)}$$

$$c(x)=\frac{64\sigma(x)P_aLb}{\pi^6\omega(d-x)}\frac{1+\beta^2}{(1+\beta^2)^2+\frac{\sigma^2}{\pi^4}} \quad \text{(Eq. 34)}$$

where $\lambda_a$ and $\lambda_0$ are the mean free path of gas modelcules at the operating pressure ($P_a$) and atmospheric pressure ($P_0$), respectively, Kn is the Knudsen number, η and $\eta_{eff}$ are the nominal and effective viscosities of air, respectively, ω=2πf is the MEMS vibrational angular rate, β=b/L is the microbeam aspect ratio, set to unity and σ(x) is the squeeze number.

In one implementation, the MEMS device is operated at a pressure of 20 Pa using $V_{DC}$=10 V and A=5 V RMS with f=192 Hz. The delay value, T was chosen to be 0.9 s and the feedback gain α=0.1 V/μm was used. The modulation mask was chosen to be composed of a random sequence of 0.5 and 0.7. To ensure sensitivity to inputs, J(t) was linearly scaled to be in the range [0.4, 0.8]. The reservoir in this work was composed of N=100 virtual nodes with θ=0.009 s.

The NARMA10 simulation in this implementation was carried out using a sequence of 1000 random inputs (Length (u)=1000). To ensure good linear fitting, the number of time steps, M, must be chosen such that M>N. To ensure that, the input rate of the NARMA inputs, IR, was calculated using:

$$IR = 150N\theta/\text{length}(u) \qquad \text{(Eq. 35)}$$

Figure 12:
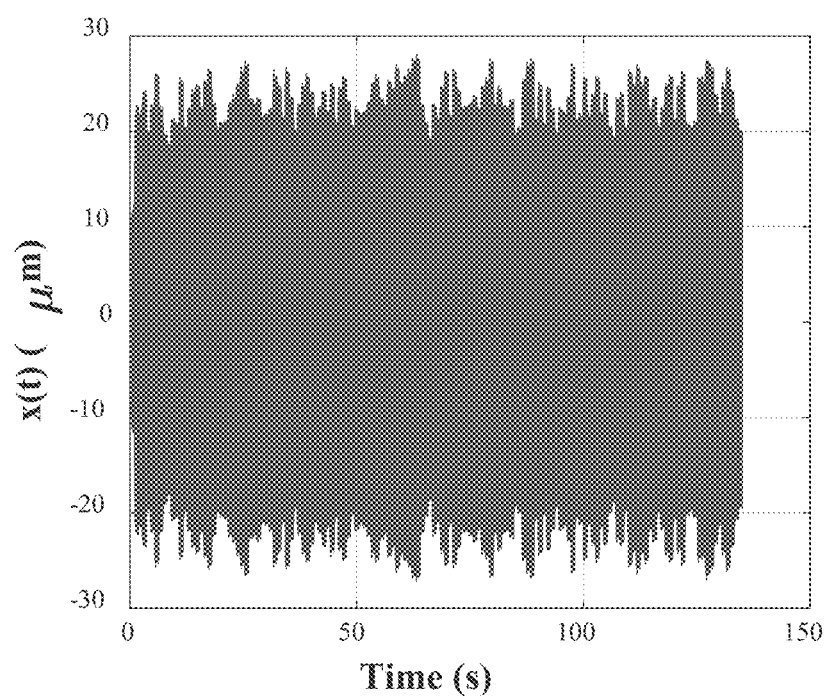
FIG. 12 is a sample MEMS response to a random input, u(t), according to one embodiment.

In one implementation, 14 different random input arrays u are used, each with a size of 1000 elements, to produce 14 different output arrays $Y_i$ and 14 MEMS responses, $X_i$, i=1,2, . . . 14. The MEMS responses were produced using the same reservoir by fixing the random mask (m(t)) to one value prior to running the simulation. A sample of the MEMS response to a random input array is shown in FIG. 12. The response loses its periodicity due to the delayed feedback, which is desirable to perform calculations. The resultant arrays from the simulation are split in half. Seven arrays were used to train the Weight Matrix, W, through linear regression, and seven were used as a test set.

To perform the training, the seven training arrays are concatenated into one array were the final value of one array is followed by the first value of the next array, using:

$$Y = \begin{bmatrix} Y_1 \\ Y_2 \\ \ldots \\ Y_7 \end{bmatrix} \qquad \text{(Eq. 36)}$$

$$X = \begin{bmatrix} X_1 \\ X_2 \\ \vdots \\ X_7 \end{bmatrix} \qquad \text{(Eq. 37)}$$

Eq. 26 can be used in the training process while setting k=0.

The goodness of the fit was found by calculating the normalized root mean square error (NRMSE) as shown in:

$$NRMSE = \sqrt{(\frac{1}{M} \frac{\sum_{i=1}^{M}(s_i - y_i)^2}{\sigma^2(y)})} \qquad \text{(Eq. 38)}$$

where $s_i$ and $y_i$ are the $i^{th}$ element of the concatenated RC output matrix S and expected output matrix Y, respectively, and $\sigma^2(y)$ is the variance of the elements in the concatenated matrix Y.

Figure 13:
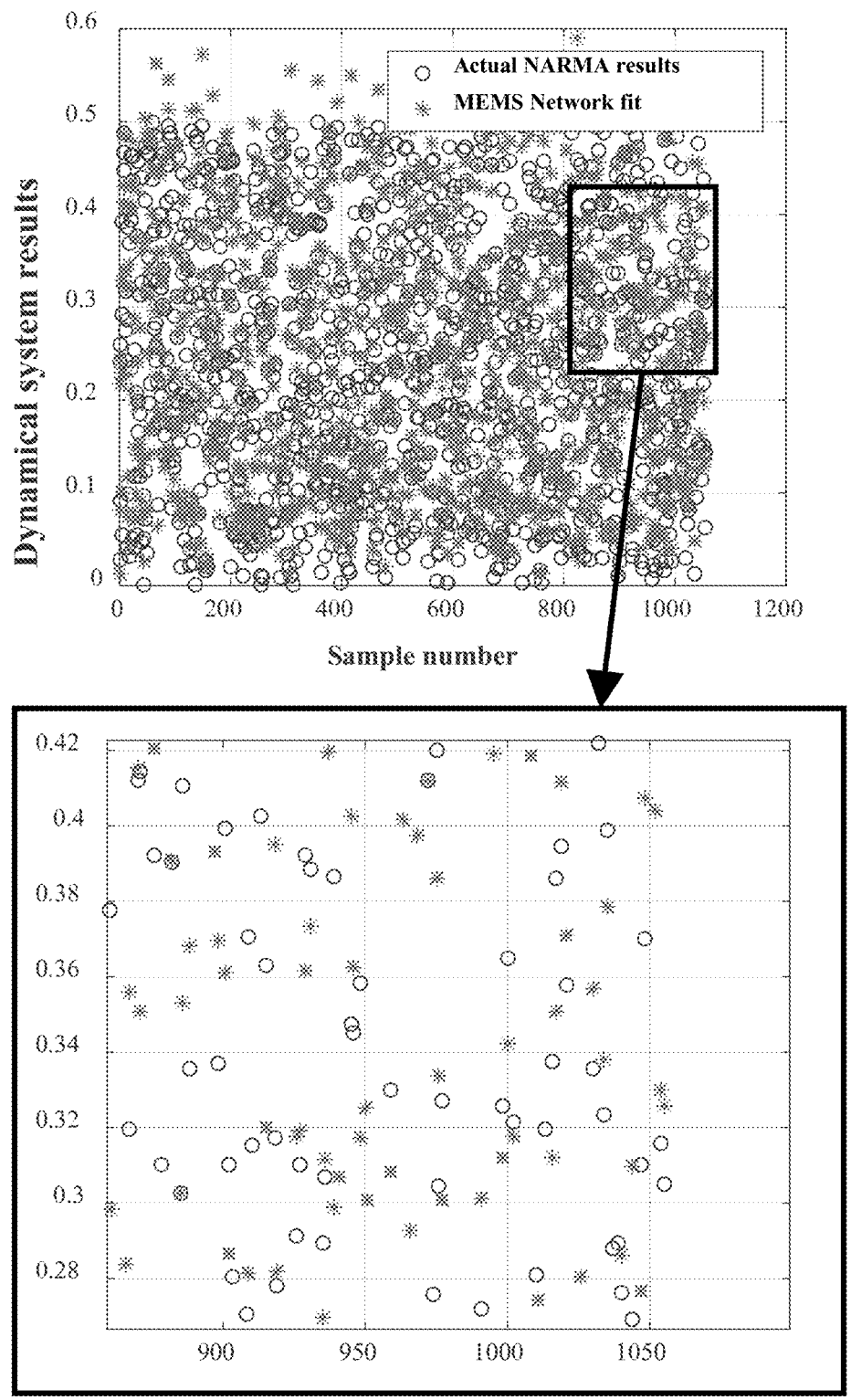
FIGS. 13 and 14 illustrate fitting results by comparing the results of NARMA10 to the results of the MEMS reservoir using the training set again as a test set, according to one embodiment.

Using linear regression (e.g., Eq. 26) to train the weights of the MEMS reservoir using the training set yields NRMSE=24.47%. The fitting results are shown in FIG. 13 by comparing the results of NARMA10 to the results of the MEMS reservoir using the training set again as a test set. Panel (a) in FIG. 13 shows a full view, and Panel (b) shows a zoomed in view.

Figure 14:
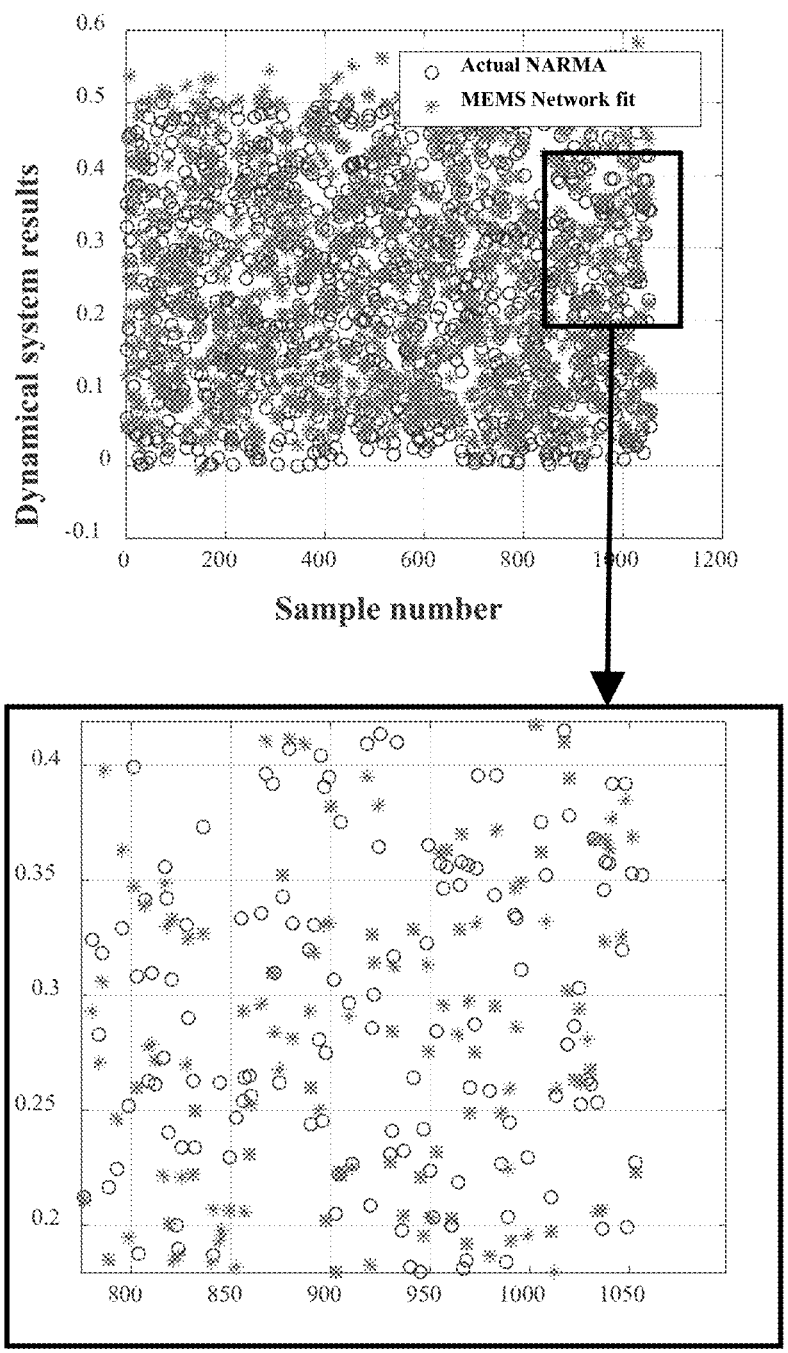

Next, the trained weights matrix was tested using the test set (see FIG. 14), composed of the seven unused simulated sets, which were concatenated in a similar fashion to that in (Eq. 36) and (Eq. 37). Panel (a) in FIG. 14 shows a full view, and Panel (b) shows a zoomed in view. The result of the test set is NRMSE=26.92% which is predictably lower than NSRME from the training set. However, it remains within an acceptable range.

As shown by the above example implementation, the use of a single MEMS as a reservoir can be used to approximate the response of a NARMA10 system. NARMA10 is considered a standard benchmark for nonlinear approximators due to its complexity and high dependence on its time history information. Therefore, the nonlinear approximator requires memory. Dynamical systems retain memory as their future inputs rely on their past state. As disclosed, we utilize a dynamical system (i.e., a MEMS device) to model another complex dynamical system (i.e., NARMA10).

The MEMS device operates as a reservoir of N nodes by creating temporally separated virtual nodes. This is achieved using the modulation mask m(t). The interaction between nodes occurs due to the delayed feedback used in the reservoir circuit, which also allows past states to visibly influence the MEMS response. Another manner of interaction between adjacent nodes occurs automatically through the reliance of each node on the information of previous nodes by virtue of the time-dependence of dynamical systems. We note here that MEMS devices reach a stable limit cycle when actuated, using moderate AC and DC voltages excitation, after passing through a brief transient state. If the MEMS device is allowed to reach the stable periodic region, the system may lose its time dependence, which decouples adjacent modes. To avoid this issue, the separation time between nodes (θ) is chosen such that it is smaller than the characteristic time (time constant) of the MEMS (θ<τ).

In one example implementation, using a MEMS device to form a reservoir with 100 nodes resulted in a NARMA10 fitting with NRMSE=24.47% using the training set and 26.92% using the testing set. Normalizing the results using the average of the actual NARMA10 response yields results even smaller (14% for the training set and 15% for the testing set). In some embodiments, higher fitting accuracies can be achieved by optimizing θ and increasing N.

We note here that simulating a virtual reservoir is extremely computationally expensive due to the complexity of the delayed differential equation of the MEMS device. However, using a real MEMS device would allow the disclosed embodiments to perform this computation in real time, which is not possible using digital computing currently.

MEMS devices can offer further attractive properties that allow them to serve as excellent reservoirs such as the existence of multiple states that can be accessed simultaneously within the MEMS device by relying on each of the MEMS modeshapes as a state rather than simply studying the deflection of the MEMS device. MEMS devices are also capable of sensing external inputs. This enables MEMS devices to perform as dedicated sensing-and-computing units simultaneous.

Edge of Chaos

A major obstacle in the reservoir computing field is the lack of dynamical understanding of the systems proposed for computing. Consequently, researchers are forced to analyze the utilized dynamical system as a black box, which is optimized by scanning the parameter space—by trial and error. This limitation also results in the lack of a baseline for comparing various RC systems. Three requirements are loosely defined in the literature for a reservoir dynamical system: (R1) Input separability, (R2) Possessing fading memory, and (R3) Echo state property. R1 signifies the system's ability to differentiate between two different inputs by mapping them to distinct outputs. This requirement is typically satisfied when the system possesses sufficient nonlinear complexity. For example, when a reservoir computing scheme ψ(.) is subjected to two distinct input streams $u_1(t)$ and $u_2(t)$, the reservoir output is $y_1(t)$ and $y_2(t)$ such that $y_1(t) \neq y_2(t)$. R1 is satisfied in the chaotic regime, where the system separates even extremely similar inputs. However, in practice, the separation property should take into consideration that similar inputs are still mapped to the same output to eliminate sensitivity to noise. Thus, operation in the chaotic regime is not ideal. R2 and R3 represent the ability of the system to prioritize recent inputs and forget past inputs and eventually forget past inputs. Properties R2 and R3 are satisfied if the reservoir state is only a function of a finite number of past input values, up to $\tau_m$:

$$x(t) = F(x(t-1), u(t-1), \ldots, u(-\infty)) = F(x(t-1), u(t-1), \ldots, u(t\tau_m)) \quad \text{(Eq. 39)}$$

A particular example that satisfies R2 and R3 is operation around a fixed point attractor. In this case, $x(t)=F(x(t-1))=x(t-1)$. However, here, the system exhibits simple dynamics, which makes it ill-suited for the separation property. Interestingly, there exists a region that offers great separation (R1) while retaining the echo state property (R2 and R3). This region, named the "edge of chaos," was previously found in Boolean network applications to be ideal for computation and later in reservoir computing. There exists a hard edge between chaos in many computational systems, at which computation is preferred. In some embodiments, we propose to use Bifurcation analysis to define the edge of chaos in MEMS devices.

Figure 15:
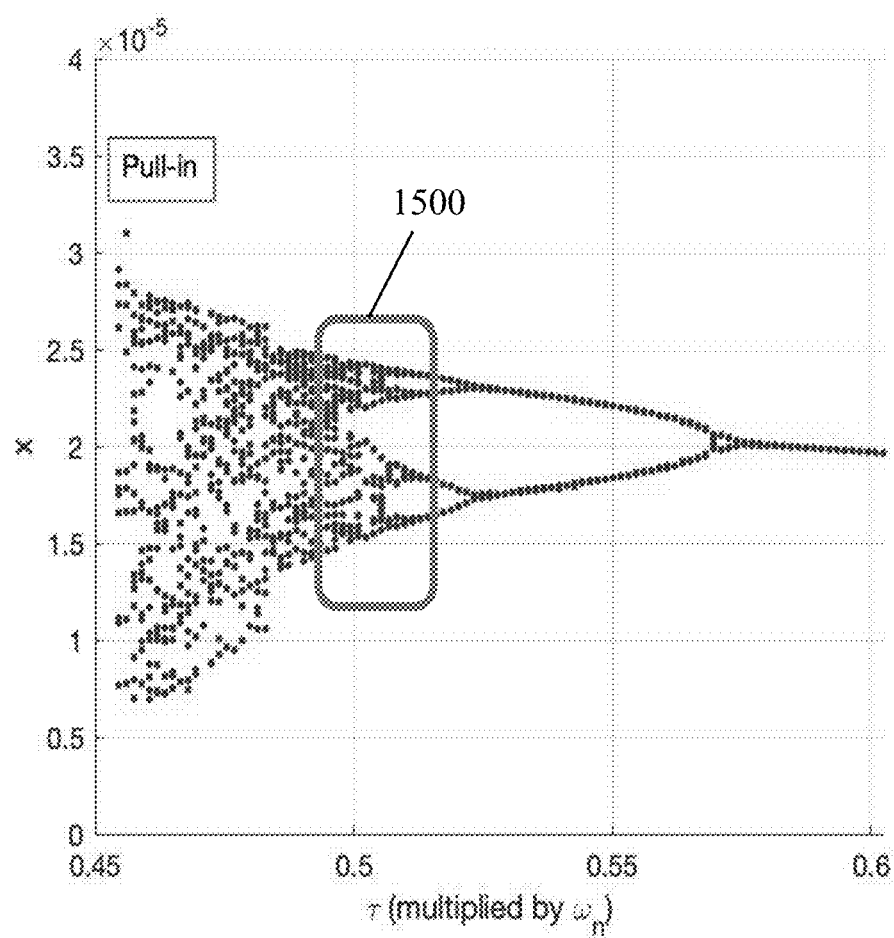
FIG. 15 is a MEMS bifurcation diagram as a function of feedback delay time, according to one embodiment.

Using this approach, the dynamical complexity of the MEMS system can be assessed to qualitatively reach a suitable dynamical regime. For example, the highlighted region 1500 in FIG. 15 shows an example of MEMS dynamics tuning by applying positive delayed feedback to reach an overall effective regime of operation for a fixed input voltage.

Modal Interactions

The dynamical richness of the MEMS device may be further increased by taking advantage of the high-dimensionality of microbeams. As a microbeam, the MEMS device dynamics are given by:

$$\frac{\partial^2}{\partial x^2}\left(EI\frac{\partial^2 w(w,t)}{\partial x^2}\right) + \rho A\frac{\partial^2 w(x,t)}{\partial t^2} + c\frac{\partial w(x,t)}{\partial t} - N\frac{\partial^2 w(x,t)}{\partial x^2} = f_e(w(x,t), V(t)) + \ddot{y}(t) \quad \text{(Eq. 40)}$$

where, the transverse displacement of the microbeam at any distance along its length x and any time t is given by $w(x, t)$. The microbeam is characterized by its Young Modulus of elasticity E and its mass density p. The microbeam has a cross-sectional area A and the second moment of area of I. The modeshapes interact with each other inherently through the microbeam dynamics. These interactions can be modified by using time-multiplexing techniques. MEMS microbeam can be viewed as an N single-degree-of-freedom (SDoF) spring-mass-damper system, where N is the number of microbeam modeshapes to produce a full interconnected reservoir computer, or a virtual reservoir computing ensemble (VIRCE). Each virtual reservoir computer, corresponding to a modeshape, will possess their individual properties (e.g., dynamical richness, fading memory) and will interact with another virtual reservoir computer internally.

RC MEMS Modal Sensor

Figure 16:
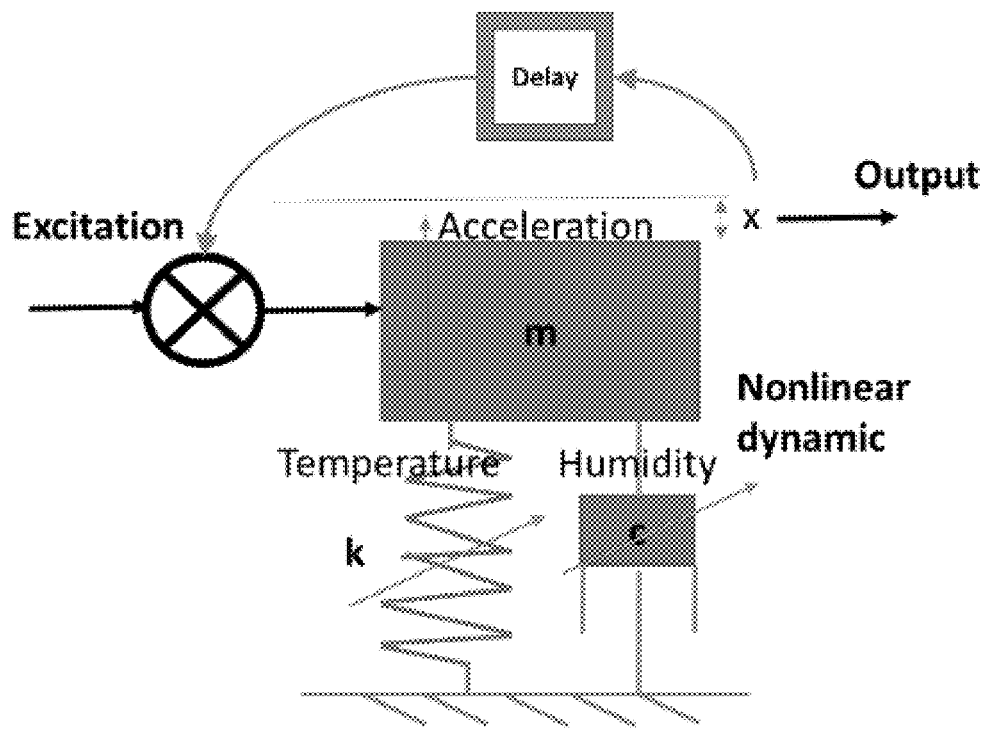
FIG. 16 is a MEMS RC modal approach, according to one embodiment.
Figure 17:
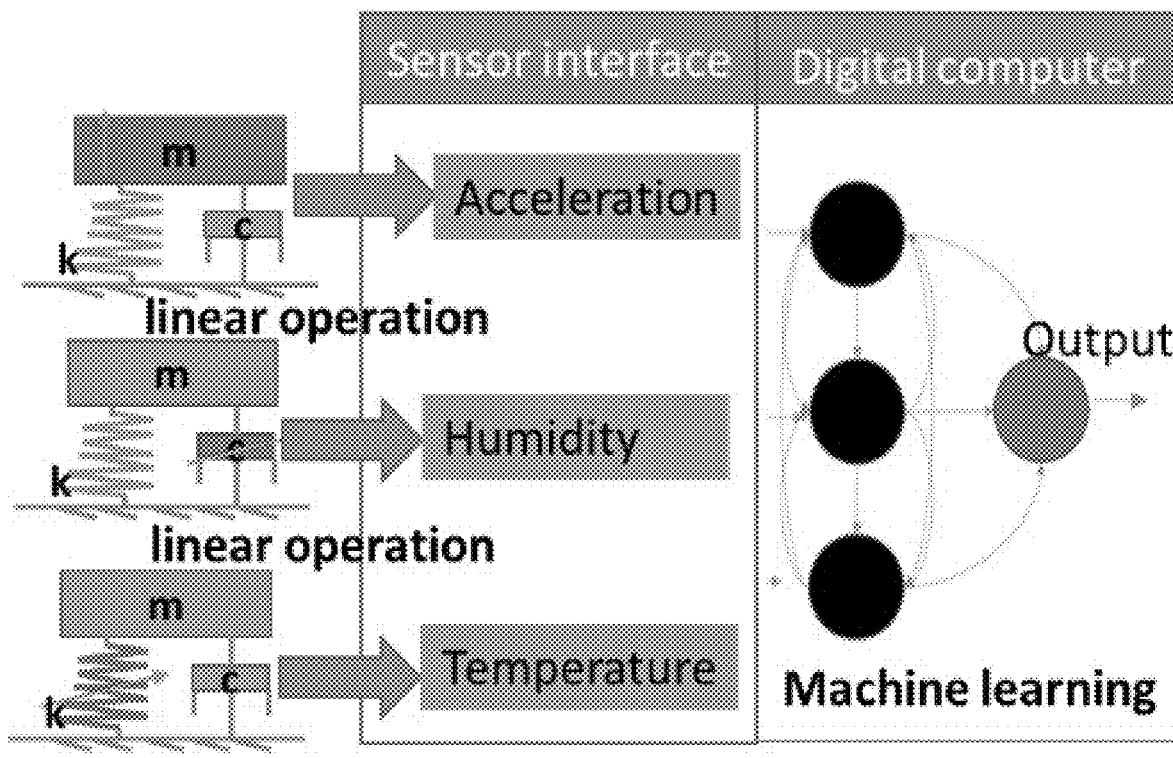
FIG. 17 is a conventional multimodal sensor approach, according to one embodiment.

In some embodiments, the disclosed MEMS RC approach can be expanded to realize a novel modal sensor approach. In this approach, the dynamic response of a single electrostatically-actuated MEMS device can be optimized to respond simultaneously to multiple measurements of interest (e.g., temperature, humidity, and acceleration), and its collective response is trained to classify, for example, the human thermal comfort level as shown in FIG. 16. This proposed approach has major advantages compared to the current multimodal sensor approaches that focus on the collection of selective data for each sensor measurement, and in the end, these data have to be sent outside of a sensing device to be processed together (see, e.g., FIG. 17). Conventional approaches lead to demanding device requirements, such as very selective and sensitive sensors, different types of complex readouts, and processing units with high power consumption that may exceed the very strict power budget of wearable devices. A multimodal sensor approach, as disclosed, can be more efficient if these measurements are processed at the same time and location.

As such, embodiments of the disclosure provide a novel multimodal sensor approach that simultaneously acquires and processes multiple measurements at the same sensing physical layer. In this approach, the MEMS dynamic that captures environment-induced parameter change and external acceleration will be governed by:

$$m(\eta)\ddot{x}(t) + c(\eta)\dot{x}(t) + k(\eta)x(t) = F_e(x(t), V(t)) + m\ddot{y}(t) \quad \text{(Eq. 41)}$$

where all MEMS parameters may change due to environmental parameters $\eta$. For instance, m may be altered due to the presence of particles on the microbeam due to coating material while k and c may change with temperature, and humidity, respectively.

Experimental Setup

In the next sections, we show the performance of the MEMS RC using the modified RC BTM scheme of using for computing only. Afterward, we show the performance of the MEMS RC in a sensing-and-computing task. The computational task chosen is a binary classification signal, in which the MEMS sensor is used to distinguish between two input waveforms: rectangular waveform and triangular waveform. This task, while simple, is non-trivial. Furthermore, it enables simple replication, especially in the sensing-and-computing task due to the ability to generate similar signals using a vibration shaker.

A commercial MEMS accelerometer was used as the reservoir in the RC scheme. The dynamics of the MEMS accelerator are considered to be govern by a lumped model with an equation of motion:

$$\ddot{x}(t) + 2\zeta wn\dot{x}(t) + wnx(t) = \varepsilon A(V_{DC}J(t)\alpha x(t-\tau))^2/2meff(dx)^2 \quad \text{(Eq. 42)}$$

where $\ddot{z}(t)$ is the MEMS microbeam deflection at time t, the dot operator represents temporal derivatives, and $V_{DC}$ is the biasing DC voltage. Example values of the MEMS parameters in (Eq. 42) are found in Table I. Additional information about the MEMS device can be found in a previous work (F. M. Alsaleem, M. I. Younis and a. H. M. Ouakad, "On the nonlinear resonances and dynamic pull-in of electrostatically actuated resonators," Journal of Micromechanics and Microengineering, vol. 19, no. 4, p. 045013, 2009), which is incorporated herein by reference. We note here that the MEMS deflections at intervals of θ are considered to be the state of the RC virtual neuron.

To demonstrate the computational ability of the MEMS device, a classification task was considered. In this task, the MEMS reservoir computer, shown in FIG. 4B, is subject to a waveform (for example, rectangular or triangle). The RC is tasked with classifying the input waveform into either a rectangular waveform (RC output y*=1) or a triangle waveform (RC output y*=−1).

Two types of reservoir inputs are considered: electrical inputs (pure computation) and acceleration inputs (sensing and computing). The experiment can be conducted using the setup shown in FIG. 18 for both tasks. The response of the reservoir computing virtual nodes was measured by measuring the MEMS response using a laser vibrometer.

Computing: Classification of Electrical Input Waveforms

In one implementation, the system attempts to classify an electric waveform into a rectangular signal or a triangular signal. The choice of θ and N used to inform the success of the reservoir computer. θ was chosen such that θ≪$\tau_{MEMS}$, while N was chosen such that Nθ≫$\tau_{MEMS}$. Moreover, N and θ were also chosen to enable the utilization of a relatively high number of virtual nodes to satisfy the conditions of RC. In some implementations, results that the MEMS dynamics are sufficiently complex to perform the given classification task without the need for a feedback loop, i.e., α=0 in what follows.

Figure 18:
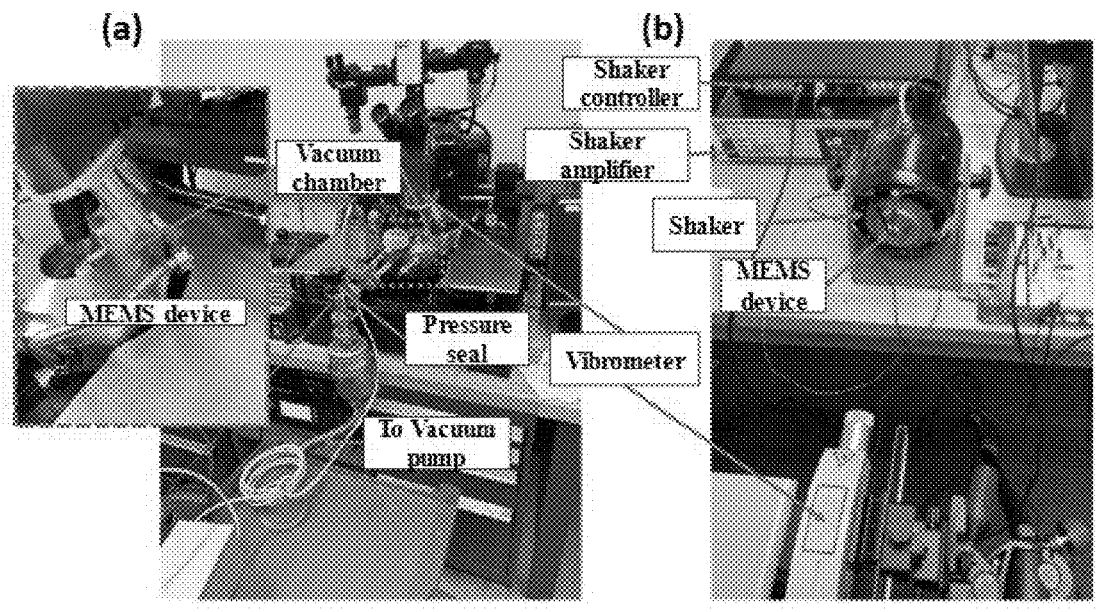
FIG. 18 shows experimental setups according to various embodiments.

The experiments were conducted using the setup in FIG. 18. FIG. 18 panel (a) shows the experimental setup used for the electrical waveform classification. The MEMS device is operated in a vacuum chamber to control the memory of the virtual reservoir. However, due to the size of the MEMS device, it is sensitive to the vacuum pump vibration. The velocity of the MEMS vibration is measured using a laser vibrometer and the deflection of the MEMS microbeam is extracted from the filtered measured velocity.

FIG. 18 panel (b) shows the experimental setup used for the sensing and computing task. The MEMS device is fixed on a shaker. The MEMS response is measured as the difference between the deflection of the microbeam deflection and the ceramic base deflection. The vibration shaker is controlled through a dedicated adaptive shaker controller and shaker amplifier. The controller was also used to synchronize the input and output data collection task.

The MEMS deflection response was attained by integrating the velocity measurement from the vibrometer. The deflection drift due to integrating the vibrometer signal was eliminated by applying a high-pass filter to the velocity signal ahead of integration with a cut-off frequency $f_H$=20 Hz. The echo state property is important for the performance of a reservoir computer. This property can be controlled by controlling the squeeze damping in the system through controlling the pressure of air surrounding the MEMS device using a vacuum chamber. For the tested setup, operation at atmospheric pressure results in very rapidly decaying transience, which leads to node-decoupling between the MEMS virtual nodes. This results in unsatisfactory results (~40% success rate in the testing set).

Higher vacuum leads to longer memory. However, this also leads to increasing the processing time as Nθ≫$\tau_{MEMS}$. In some implementations, due to the large mass of the used MEMS device, ambient noise due to the operation of the vacuum pump introduces a deterministic low-frequency noise into the system. Alternatively, sealing the vacuum chamber and turning off the vacuum pump ahead of the experiment will lead to a pressure buildup as the experiment progresses due to imperfections in the vacuum seal, which also adds another degree of variability for the experiment. In some implementations, the following parameter values were considered: θ=1 ms, N=100, τ=0.1 s, $V_{DC}$=0V. The MEMS device was tasked with classifying a train of rectangle and triangle signals. The triangle and square signals had an extremely low period (1.4 s) to operate the MEMS device at the quasi-static regime. The input to the MEMS device was a modulated version of the pulse train using (Eq. 2) with $w_j$={0.3,1} with a 90% probability that the mask will take the value of 1.

Figure 19:
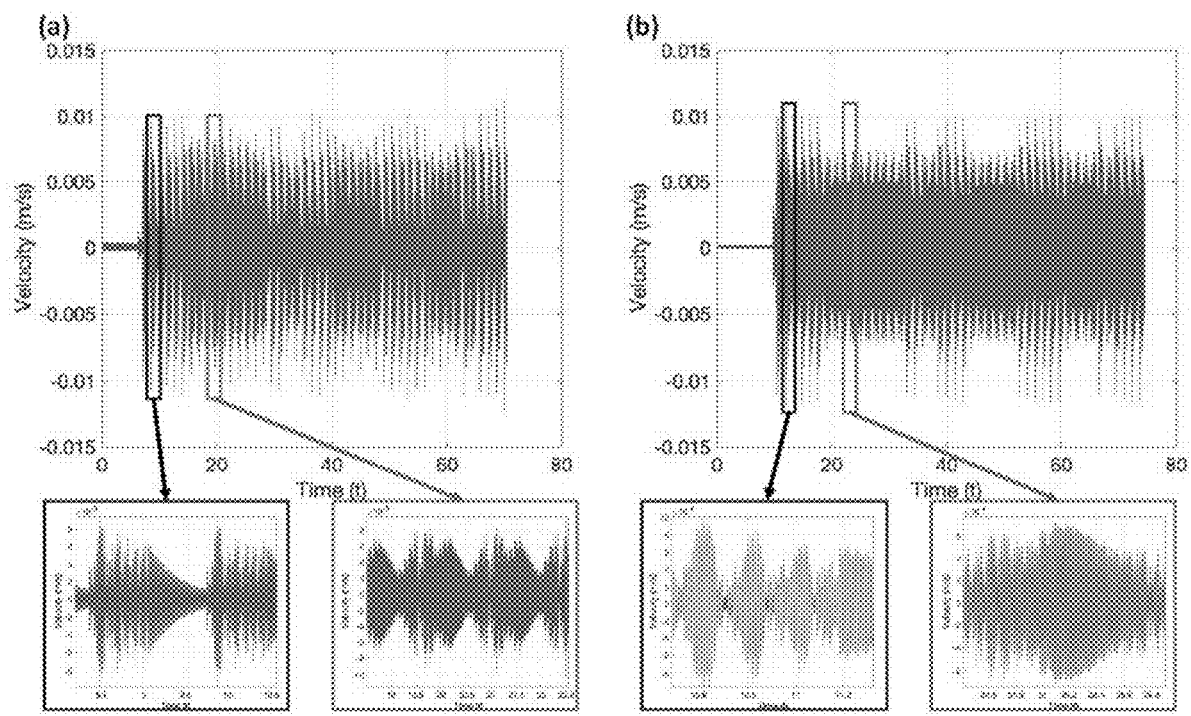
FIG. 19 shows the response of the MEMS device to a train of time-multiplexed train of rectangle and triangle signals, according to embodiments.

FIG. 19 shows the response of the MEMS device to the modulated rectangular and triangle signals when the vacuum pump is turned off (FIG. 19 panel (a)) during operation and when it was left on (FIG. 19 panel (b)). The modulated input ensures the MEMS device remains transient even when operated with a signal with a very low frequency. The attained response is used to construct the virtual states matrix X by down-sampling the integrated velocity signal measured by the vibrometer at a sampling frequency θ=1 ms. As the test signal waveform was run for 60.2 s, this results in 602 computational samples, each evaluated every 100 ms. The test samples were split into 80%-20% training-testing sets. The training set was used to optimize the output weights for two classifiers: A rectangle classifier (output=1 if input is rectangle and −1 if triangle); and a triangle classifier (output=1 if input is triangle and −1 if rectangle). Each classifier will have a separate weight to train W(rectangle) and $W_{oT}$(triangle) using Ridge regression computed by $W_o=(X^TX+k\times I)^{-1}X^TY$.

The testing set was used to evaluate the success of the RC scheme. The MEMS RC is considered successful at the classification task using a winner takes all (WTA) scheme: if the output of the classifier corresponding to the input waveform produces an output higher than the other classifier. The success rate is calculated as:

$$\text{SuccessRate} = \frac{\#TestingSetCorrectClassifications}{\#SamplesInTestingSet} \times 100\% \quad \text{(Eq. 43)}$$

Figure 20:
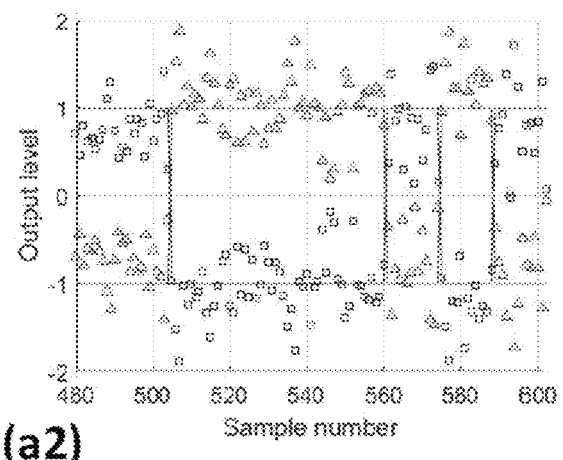
FIG. 20 illustrates the experimental response of the MEMS RC using data from FIG. 19 to the testing dataset when (panels (a1), (a2)) operated in a leaking vacuum chamber, and (panels (b1), (b2)) operated with a vacuum pump turned on, in accordance with some embodiments. Panel a1 and panel b1 show the real-time results of the RC in both cases with success rates of 99.8% and 99.66%, respectively. Panel (a2) and panel (b2) show the averaged response of the RC over 7 computing time-steps with a classification success rate of 100%.
Figure 20:
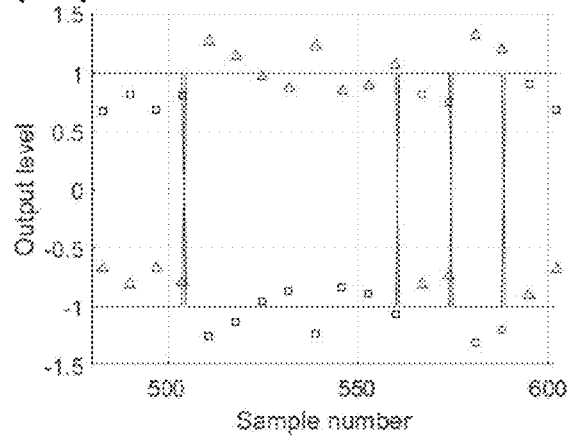
Figure 20:
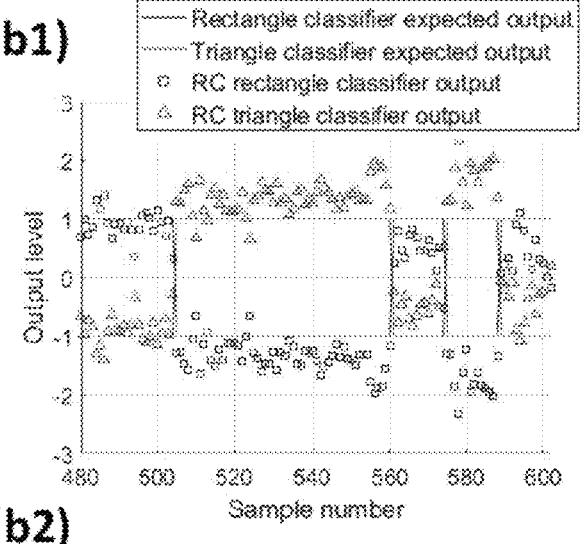
Figure 20:
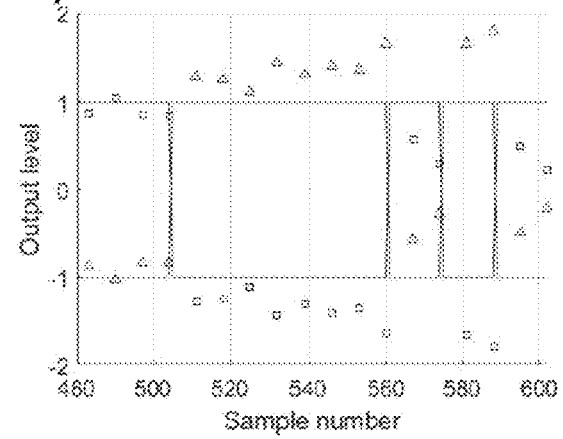

FIG. 20 shows the results of the reservoir computing scheme both when under influence of pressure fluctuation (pump turned off, FIG. 20 panels (a1) and (a2)) and pump noise (FIG. 20 panels (b1) and (b2)). When the MEMS RC is operated in low pressure without a pump (panel (a1)), the SuccessRa e=99.8% in this case. When the pump is on, the success rate is comparable, SuccessRa e=99.66% (panel (b1)). While there is a large variability in the actual output of the rectangle and square classifiers, the classification task is successful. SuccessRate can be improved to 100% if the classification was performed on an averaged reservoir output (panel (a2) and panel (b2)). In both cases, pressure fluctuation and ambient deterministic noise were completely eliminated by the reservoir computing scheme.

Figure 21:
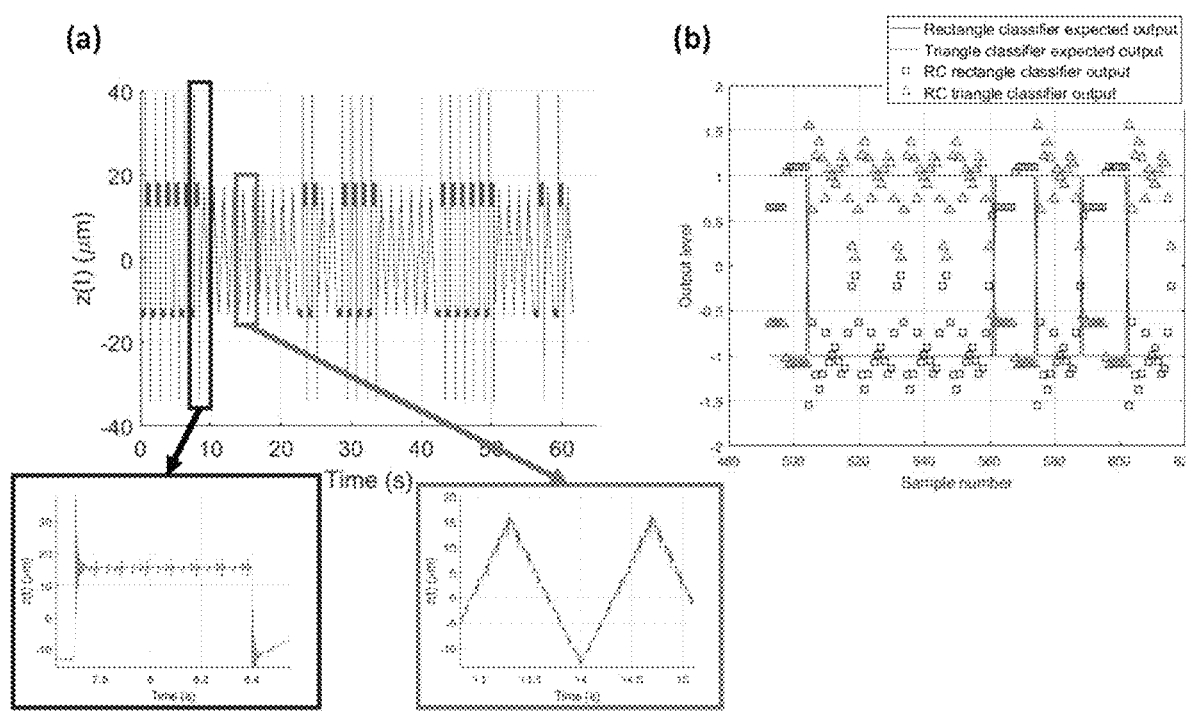
FIG. 21 illustrates a simulated response of the MEMS RC when operated under vacuum. The MEMS device is subject to an acceleration waveform and is expected to classify the input acceleration signal into a rectangle signal or a triangle signal. Panel (a) shows a time-series response of the MEMS device showing that the MEMS device remains in transience in the presented scheme. Inserts of panel (a) show a zoomed view of the response to a rectangular signal (left) and a triangular signal (right). Panel (b) shows classifiers output for the testing set showing great classification ability with a success rate of 99.2%, in accordance with some embodiments.

Simultaneous Sensing and Computing: Classification of Acceleration Input Waveforms A major advantage of using sensory elements to perform reservoir computing is the ability of performing sensing and computing co-locally. In this case, the sensory element would be capable of extracting complex information from its environment. Embodiments of the disclosure provide a MEMS accelerometer capable of performing classification on a train of acceleration signals. For example, the MEMS accelerometer is tasked with classifying whether the input received is a rectangular signal or a square signal. However, in this design, it may not be possible to time-multiplex the input acceleration signal that the MEMS device receives in practice. This causes the RC scheme to fail when trying to classify slow input signals, as the MEMS device will eventually reach steady state and fail to generate useful virtual node information. In order to solve this problem, some embodiments introduce a new time-multiplexed electrical signal that is independent of the input acceleration signal. The only goal of this time-multiplexed signal is to force the MEMS accelerometer to remain in the transient regime. Therefore, the response of the MEMS sensing-and-computing (SAC) unit is modified to reflect the addition of the external acceleration signal (base-excitation) and new time-multiplexed signal as shown in equation (Eq. 44):

$$m_{eff}\ddot{z}(t)+2\zeta wn\dot{z}(t)+wnz(t)=\varepsilon A(V_{DC}+J^*(t)\alpha z(t\tau))^2/2m_{eff} \\ (dz)^2-\ddot{y}(t) \quad \text{(Eq. 44)}$$

where $z(t)=x(t)-y(t)$ is the deflection of the MEMS device relative to the moving base, $y(t)$ is the displacement of the moving base and $J^*(t)$ is a time multiplied signal attained using equation (Eq. 45):

$$J(t)=w_j \times V_{DC2}, (i-1)\tau+j\theta \leq <(i-1)\tau+(j+1)\theta, j=0,2,\ldots,N-1 \quad \text{(Eq. 45)}$$

with $V_{DC}$ being an additional external DC signal. Similar to (t), $J^*(t)$ is also periodic with a period $\tau$. For the classification task, the following parameters were used in the simulation model: $\theta=1$ ms, $N=100$ nodes, $t=0.1$ s, $V_{AC}=0V$, $V_{DC}=0V$, $V_{DC}=0V$, $V_{DC2}=30V$, $w_j=\{0.3,1\}$ (with 90% chance of having a weight value of 1), Amplitude of acceleration signal=2g, period of acceleration signal=1.4 s, $\zeta=0.1$. The construction of the X matrix is similar to what was explained in the previous section. It is noted here that $z(t)$ is used here to construct the virtual node state matrix, X, instead of $x(t)$ as it is the value that is typically read from the accelerometer. The acceleration waveform train is 61.58 s, with 616 samples. The output matrix $W_o$ is calculated the same way as described above. The response of the simulated MEMS device to the acceleration waveform train is shown in FIG. 21 panel (a). The time-multiplexed signal was used to ensure the MEMS device remains transient as shown in the plot inserts. FIG. 21 panel (b) shows the outputs of the two classifiers (i.e., square and triangle) as a response to the testing set. TheSuccessRate, calculated using (Eq. 43), was found to be 99.2%.

Figure 22:
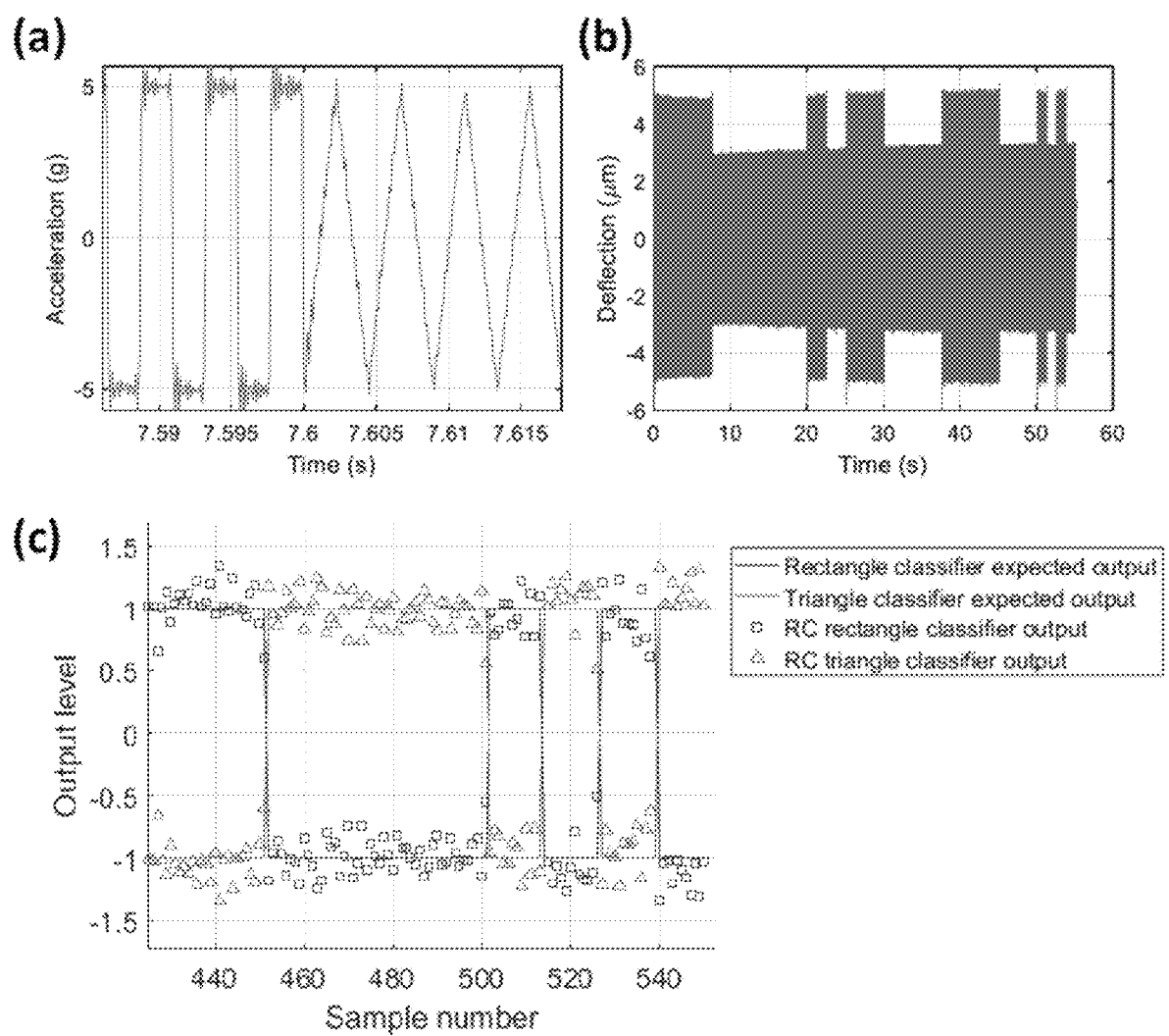
FIG. 22 illustrates in panel (a) a sample of the acceleration signal generated by the shaker, and in panel (b) the MEMS response to the vibration shaker signal and the time modulated input signal, in accordance with some embodiments. This response represents the relative displacement of the MEMS microbeam with respect to the moving base. Panel (c) shows testing set classification results showing a 99.6% correct guess percentage, in accordance with some embodiments.

The sensing and computing task was also performed experimentally using a signal train with a frequency of 222 Hz. The experiment used a signal amplitude of 5 g to allow for large MEMS deflections in the presence of squeeze film damping, to produce meaningful signal beyond the noise floor level. The signal train frequency was chosen at the lowest frequency at which the used shaker can operate at 5g. While the frequency is high enough to drive the MEMS dynamically, the rectangle and triangle signals were repeated for enough time for the MEMS device to reach steady state in the absence of an input modulated signal. For this experimental test, the RC states were sampled at a rate of $\theta=1$ ms, the RC network is composed of $N=100$ virtual nodes, the MEMS device is driven by a DC voltage of 3.5 V amplified 10 times by an external amplifier. The input DC signal was modulated with a binary modulation mask $w_i=\{0.3,1\}$ with 90% chance of taking the value of 1. The acceleration train was generated using a vibration shaker controlled by an adaptive controller. The shape of the generated acceleration signal is shown in FIG. 22 panel (a). The corresponding response of the MEMS device is shown in FIG. 22 panel (b), which was calculated by subtracting the deflection of the moving part of the MEMS structure from the deflection of the MEMS ceramic base. This response was used to construct X employing the same method as the simulated results. For training, 80% of the data points were used to create the training set and 20% of the data points were used for training. After training, the MEMS network successfully classified 99.6% of the testing data, which is on-par with similar RC schemes for this test.

The experimental results offer a successful demonstration of a reservoir computer that performs sensing and computing co-locally. The developed sensors are considered neuromorphic (neuro-inspired) sensors, as they are sensory elements equipped with neuro-inspired processing at the sensor node, inspired by the manner in which biological sensory elements operate. Such neuromorphic sensors can significantly reduce the size and power of the central processors in smart micro-systems and smart wearable devices, as a portion of the complex computation is performed at the sensor level. Neuromorphic sensors can be used to enable artificial intelligence (AI) in extremely small systems, which can enable complex feedback control in micro-robots and complex classification in wearable devices for application like fall detection and activity detection. Additionally, such utilizing neuromorphic sensors can be the foundation for the development of a new class of sensory devices that can produce sparse outputs and can measure tangible signals (examples include: gesture recognition, direct frequency-domain analysis) rather than measuring abstract analog values. The new class of sensors could also rely on transience for operation, which would likely make it faster than traditional sensory elements. Finally, due to internal computation, neuromorphic sensors may be able to produce highly accurate measurements by internally compensating for measurement disturbance in highly complex systems (such as compensation for flow changes due to the insertion of a flow rate sensor into a water pipe).

Example Applications and Use Cases

Various use cases are within the scope of the present disclosure, including for detecting gestures, detecting peripheral artery disease (PAD), or optimizing human comfort, for example.

Peripheral artery disease (PAD): As the population of the United States continues to age, new challenges have arisen in the domains of healthcare and quality of life for older adults. These challenges include the care of patients with chronic health conditions such as PAD. PAD is a prevalent atherosclerotic syndrome that produces progressive narrowing and occlusion of the arteries supplying the legs. PAD affects approximately 8 million (mostly elderly) people in the US. Although diagnosing PAD in its early-stage increases the chance of slowing disease progression and decreases the risk of major cardiovascular events, 40-60% of patients with PAD go undiagnosed in a primary care setting. Diagnostic tests for PAD are performed primarily by measuring ankle-brachial index (ABI), a fairly-high cost test that requires special training in a vascular lab. Recent research has implemented a data-driven approach using machine learning for the diagnosis of PAD. The approaches for the best care to date build diagnostic machine learning models using thirty-five (35) protein biomarkers obtained from blood samples or clinical data extracted with the use of extensive participant interviews and careful review of patient history and medical records. These approaches have significant limitations in terms of accuracy (moderate), time (require few years of medical records), resources (require protein-based lab-setting), and involvement of experts with advanced training (physicians, trained research assistants and nurse practitioners). Gait dysfunction, caused by painful tightness or cramping in the muscles of the leg, is one of the major factors impacting the quality of life for patients with PAD as it substantially reduces their activity level. In some embodiments, AI analysis reveals that the walking patterns are characteristically different in patients with PAD compared to older controls without PAD. Based on these findings, some embodiments seek to analyze the biomechanics data in a holistic approach to extract the dominant, unique gait signatures that characterize the mobility impairments of patients with PAD. Moreover, some embodiments estimate these biomechanical gait signatures using the proposed MEMS/RC accelerometer and subsequently can be used to diagnose and monitor the progression of PAD disease presentation.

Human comfort: Humans spend more than 80% of their daily time in buildings where their health and productivity are demonstrably linked to thermal comfort. Maintaining thermal comfort is not trivial due to the fundamental problem of how to build and utilize a personalized comfort model to accurately infer and effectively improve the thermal comfort of each occupant in a building. Some prior work provides a modal sensor approach in concert with machine learning that augments ambient temperature and humidity with metabolic rate, estimated form human body acceleration measurement, which can be used to accurately develop personalized comfort models. However, this approach is inefficient and requires processing data from at least three different types of MEMS sensors. To overcome this challenge, some embodiments perform comfort modeling completely at the sensor level. These embodiments expand our work of MEMS RC accelerometer to be sensitive to temperature and humidity. Specifically, the sensing element of each MEMS accelerometer can be designed to simultaneously respond to acceleration, temperature, and humidity. The MEMS RC can be trained to analyze these measurements to flag thermal discomfort.

Conclusion

The utilization of MEMS devices in the modified RC scheme disclosed herein enables co-located sensing and computing. Additional benefits are expected when exciting simultaneously multiple mode shapes of a MEMS microstructure, modeled as a contentious beam rather than a simple SDF model, to produce multiple independent virtual reservoirs with different timescales. Such a concept of using multiple reservoirs to boost the RC performance, especially asynchronous reservoirs is shown to circumvent the performance plateau as the number of virtual nodes increases.

Using this approach, a new generation of intelligent sensors can be produced without using large networks of sensory elements. Such sensors can entirely utilize transience, increasing their speeds. Furthermore, these sensors may be capable of performing edge computation by performing classification and/or prediction. For example, the disclosed RC sensors may be capable of compensating for interference due to measurement in nonlinear systems, such as compensation for flow changes due to the insertion of a flow rate sensor into a water pipe.

In conclusion, the modified reservoir computing scheme disclosed herein reduces the required electronics for RC implementation, allows for physical signal processing even in the presence of noise, and enables a reduction in the signal sampling rate while producing results on par with traditional approaches. Moreover, the disclosed embodiments enable performing the RC scheme using non-electrical signals through sensory elements.

Reference is also made to U.S. Patent Application Publication No. 2020/0041964 A1, titled "NEUROMORPHIC COMPUTING USING ELECTROSTATIC MEMS DEVICES," corresponding to U.S. patent application Ser. No. 16/526,557, filed Jul. 30, 2019, which is incorporated by reference herein.

All references, including publications, patent applications, and patents, cited herein are hereby incorporated by reference to the same extent as if each reference were individually and specifically indicated to be incorporated by reference and were set forth in its entirety herein.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A method of operating a micro-electro-mechanical-systems (MEMS) device as a reservoir computer, the method comprising:
sensing an input signal;
generating a modulated input signal based on the input signal, wherein the input signal is a continuous signal and the modulated input signal is a discretized signal;
generating a MEMS deflection signal based on the modulated input signal and a time-delayed MEMS deflection signal;
sampling the MEMS deflection signal N times during a time internal T to generate a MEMS deflection matrix, wherein MEMS deflection matrix has a size M×N, wherein N corresponds to a number of virtual nodes of the reservoir computer and M is a number of time steps of time interval T;

receiving a trained weight matrix, wherein the trained weight matrix is trained by linear regression;

multiplying the MEMS deflection matrix by the trained weight matrix to generate an output signal, wherein the output signal comprises an output of the reservoir computer; and classifying the input signal based on the output signal, wherein the sensing and the classifying of the input signal are performed simultaneously based on interactions of the virtual nodes of the reservoir computer, and wherein the interactions occur utilizing delayed feedback.

2. The method according to claim 1, wherein modulating the input signal comprises:

receiving the input signal;

sampling the input signal to generate a discretized input signal;

receiving a weight mask with randomly generated values; and multiplying the discretized input signal with the weight mask to generate the modulated input signal.

3. The method according to claim 1, wherein the MEMS deflection signal corresponds to a first time point, and generating the MEMS deflection signal comprises:

for a second MEMS deflection signal corresponding to a second time point that is before the first time point, applying a delay to the second MEMS deflection signal to generate a delayed second MEMS deflection signal;

applying a feedback gain operator the delayed second MEMS deflection signal; and modulating the delayed second MEMS deflection signal with the modulated input signal to generate the MEMS deflection signal corresponding to the first time point.

4. The method according to claim 3, wherein the MEMS device generates the MEMS deflection signal and generates the output signal co-locally.

5. The method according to claim 1, wherein the modulated input signal provides input to individual nodes of a reservoir of N nodes of the reservoir computer; and wherein the MEMS deflection signal corresponds to an output of the reservoir of the reservoir computer.

6. The method according to claim 1, wherein the MEMS deflection signal is generated by a MEMS device comprising a lower electrode attached to a sensor base and a proof mass attached to cantilever beams, wherein the cantilever beams are attached to the sensor base at an attachment point.

7. The method according to claim 1, wherein the input signal is an input acceleration signal, and wherein classifying the input signal based on the output signal includes classifying the input acceleration signal as either a rectangle signal or a triangle signal.

8. The method according to claim 1, wherein the MEMS device includes a MEMS accelerometer.

9. A micro-electro-mechanical-systems (MEMS) device configured to operate as a reservoir computer including performing sensing and computing co-locally, comprising:

circuitry for sensing an input signal;

circuitry for generating a modulated input signal based on the input signal, wherein the input signal is a continuous signal and the modulated input signal is a discretized signal;

circuitry for generating a MEMS deflection signal based on the modulated input signal and a time-delayed MEMS deflection signal;

circuitry for sampling the MEMS deflection signal N times during a time internal T to generate a MEMS deflection matrix, wherein MEMS deflection matrix has a size M×N, wherein N corresponds to a number of virtual nodes of the reservoir computer and M is a number of time steps of time interval T;

circuitry for receiving a trained weight matrix, wherein the trained weight matrix is trained by linear regression;

circuitry for multiplying the MEMS deflection matrix by the trained weight matrix to generate an output signal, wherein the output signal comprises an output of the reservoir computer; and circuitry for classifying the input signal based on the output signal, wherein the sensing and the classifying of the input signal are performed simultaneously based on interactions of the virtual nodes of the reservoir computer, and wherein the interactions occur utilizing delayed feedback.

10. The MEMS device according to claim 9, wherein modulating the input signal comprises:

receiving the input signal;

sampling the input signal to generate a discretized input signal;

receiving a weight mask with randomly generated values; and multiplying the discretized input signal with the weight mask to generate the modulated input signal.

11. The MEMS device according to claim 9, wherein the MEMS deflection signal corresponds to a first time point, and generating the MEMS deflection signal comprises:

for a second MEMS deflection signal corresponding to a second time point that is before the first time point, applying a delay to the second MEMS deflection signal to generate a delayed second MEMS deflection signal;

applying a feedback gain operator the delayed second MEMS deflection signal; and modulating the delayed second MEMS deflection signal with the modulated input signal to generate the MEMS deflection signal corresponding to the first time point.

12. The MEMS device according to claim 11, wherein the MEMS device generates the MEMS deflection signal and generates the output signal co-locally.

13. The MEMS device according to claim 9, wherein the modulated input signal provides input to individual nodes of a reservoir of N nodes of the reservoir computer; and wherein the MEMS deflection signal corresponds to an output of the reservoir of the reservoir computer.

14. The MEMS device according to claim 9, wherein the MEMS deflection signal is generated by a MEMS device comprising a lower electrode attached to a sensor base and a proof mass attached to cantilever beams, wherein the cantilever beams are attached to the sensor base at an attachment point.

15. The MEMS device according to claim 9, wherein the input signal is an input acceleration signal, and wherein classifying the input signal based on the output signal includes classifying the input acceleration signal as either a rectangle signal or a triangle signal.

16. The MEMS device according to claim 9, wherein the MEMS device includes a MEMS accelerometer.

17. A wearable device, comprising:

a housing; and micro-electro-mechanical-systems (MEMS) device configured to operate as a reservoir computer including performing sensing and computing co-locally, comprising:
circuitry for sensing an input signal;
circuitry for generating a modulated input signal based on the input signal, wherein the input signal is a continuous signal and the modulated input signal is a discretized signal;
circuitry for generating a MEMS deflection signal based on the modulated input signal and a time-delayed MEMS deflection signal;
circuitry for sampling the MEMS deflection signal N times during a time internal T to generate a MEMS deflection matrix, wherein MEMS deflection matrix has a size MXN, wherein N corresponds to a number of virtual nodes of the reservoir computer and M is a number of time steps of time interval T;
circuitry for receiving a trained weight matrix, wherein the trained weight matrix is trained by linear regression;
circuitry for multiplying the MEMS deflection matrix by the trained weight matrix to generate an output signal, wherein the output signal comprises an output of the reservoir computer; and
circuitry for classifying the input signal based on the output signal, wherein the sensing and the classifying of the input signal are performed simultaneously based on interactions of the virtual nodes of the reservoir computer, and wherein the interactions occur utilizing delayed feedback.

18. The wearable device according to claim 17, wherein modulating the input signal comprises:
receiving the input signal;
sampling the input signal to generate a discretized input signal;
receiving a weight mask with randomly generated values; and
multiplying the discretized input signal with the weight mask to generate the modulated input signal.

19. The wearable device according to claim 17, wherein the MEMS deflection signal corresponds to a first time point, and generating the MEMS deflection signal comprises:
for a second MEMS deflection signal corresponding to a second time point that is before the first time point, applying a delay to the second MEMS deflection signal to generate a delayed second MEMS deflection signal;
applying a feedback gain operator the delayed second MEMS deflection signal; and
modulating the delayed second MEMS deflection signal with the modulated input signal to generate the MEMS deflection signal corresponding to the first time point.

20. The wearable device according to claim 17,
wherein the modulated input signal provides input to individual nodes of a reservoir of N nodes of the reservoir computer; and
wherein the MEMS deflection signal corresponds to an output of the reservoir of the reservoir computer.

* * * * *